(12) United States Patent
Lee et al.

(10) Patent No.: US 10,910,552 B2
(45) Date of Patent: Feb. 2, 2021

(54) MAGNETIC MEMORY DEVICE, METHOD FOR MANUFACTURING THE SAME, AND SUBSTRATE TREATING APPARATUS

(71) Applicant: SAMSUNG ELECTRONICS CO., LTD., Suwon-si (KR)

(72) Inventors: Joonmyoung Lee, Anyang-si (KR); Yong Sung Park, Suwon-si (KR); Jeong-Heon Park, Hwaseong-si (KR); Hyun Cho, Changwon-si (KR); Ung Hwan Pi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 16/352,957

(22) Filed: Mar. 14, 2019

(65) Prior Publication Data

US 2020/0091412 A1  Mar. 19, 2020

(30) Foreign Application Priority Data

Sep. 17, 2018 (KR) .................. 10-2018-0111015

(51) Int. Cl.
| | |
|---|---|
| *H01L 43/02* | (2006.01) |
| *H01L 43/10* | (2006.01) |
| *H01L 21/67* | (2006.01) |
| *G11C 14/00* | (2006.01) |
| *H01L 43/12* | (2006.01) |
| *H01L 27/108* | (2006.01) |

(Continued)

(52) U.S. Cl.
CPC .......... *H01L 43/02* (2013.01); *G11C 14/0036* (2013.01); *G11C 14/0081* (2013.01); *H01L 21/67155* (2013.01); *H01L 27/224* (2013.01); *H01L 27/226* (2013.01); *H01L 43/10* (2013.01); *H01L 43/12* (2013.01); *G11C 11/161* (2013.01); *H01L 27/108* (2013.01); *H01L 27/11* (2013.01)

(58) Field of Classification Search
CPC ......... H01L 43/02; H01L 43/10; H01L 43/12; H01L 21/67155; H01L 21/67109; H01L 27/226; H01L 27/224; H01L 27/11; H01L 29/82; H01L 39/16; G11C 4/0036; G11C 14/0081
USPC ................ 257/421, 414, 295, 108, E43.001, 257/E43.006, E31.001, E29.167, E29.323; 365/158, 171, 225.5, 232; 438/3, 4, 5
See application file for complete search history.

(56) References Cited

U.S. PATENT DOCUMENTS

| | | |
|---|---|---|
| 6,314,020 B1 | 11/2001 | Hansen et al. |
| 8,711,613 B2 | 4/2014 | Ranjan et al. |

(Continued)

*Primary Examiner* — Dao H Nguyen
(74) *Attorney, Agent, or Firm* — Lee IP Law, P.C.

(57) ABSTRACT

A magnetic memory device, a method for manufacturing a magnetic memory device, and a substrate treating apparatus, the device including a substrate including a first memory region and a second memory region; a first magnetic tunnel junction pattern on the first memory region, the first magnetic tunnel junction pattern including a first free pattern and a first oxide pattern on the first free pattern; and a second magnetic tunnel junction pattern on the second memory region, the second magnetic tunnel junction pattern including a second free pattern and a second oxide pattern on the second free pattern, wherein a ratio of a thickness of the first oxide pattern to a thickness of the first free pattern is different from a ratio of a thickness of the second oxide pattern to a thickness of the second free pattern.

12 Claims, 17 Drawing Sheets

(51) Int. Cl.
*H01L 27/22* (2006.01)
*H01L 27/11* (2006.01)
*G11C 11/16* (2006.01)

(56) References Cited

U.S. PATENT DOCUMENTS

| | | | |
|---|---|---|---|
| 8,724,377 B2* | 5/2014 | Yamanaka | H01L 43/12 |
| | | | 365/158 |
| 9,691,969 B2 | 6/2017 | Chuang et al. | |
| 9,805,816 B2 | 10/2017 | Jan et al. | |
| 10,147,873 B2* | 12/2018 | Lee | G11C 11/161 |
| 10,210,920 B1* | 2/2019 | Chen | H01L 27/222 |
| 10,644,231 B2* | 5/2020 | Peng | G11C 11/161 |
| 2006/0237808 A1* | 10/2006 | Saito | G11C 19/0808 |
| | | | 257/421 |
| 2009/0289289 A1 | 11/2009 | Lai | |
| 2013/0119494 A1* | 5/2013 | Li | H01L 43/08 |
| | | | 257/421 |
| 2015/0371694 A1* | 12/2015 | Solihin | G11C 11/161 |
| | | | 712/14 |
| 2016/0300612 A1 | 10/2016 | Manipatruni et al. | |
| 2017/0053965 A1* | 2/2017 | Baek | H01L 23/528 |
| 2017/0092851 A1* | 3/2017 | Han | H01L 43/10 |
| 2018/0114558 A1 | 4/2018 | Yoda et al. | |
| 2018/0158526 A1 | 6/2018 | Kim et al. | |
| 2019/0051700 A1* | 2/2019 | Kim | G11C 11/161 |
| 2019/0214554 A1* | 7/2019 | Li | H01F 10/329 |

\* cited by examiner

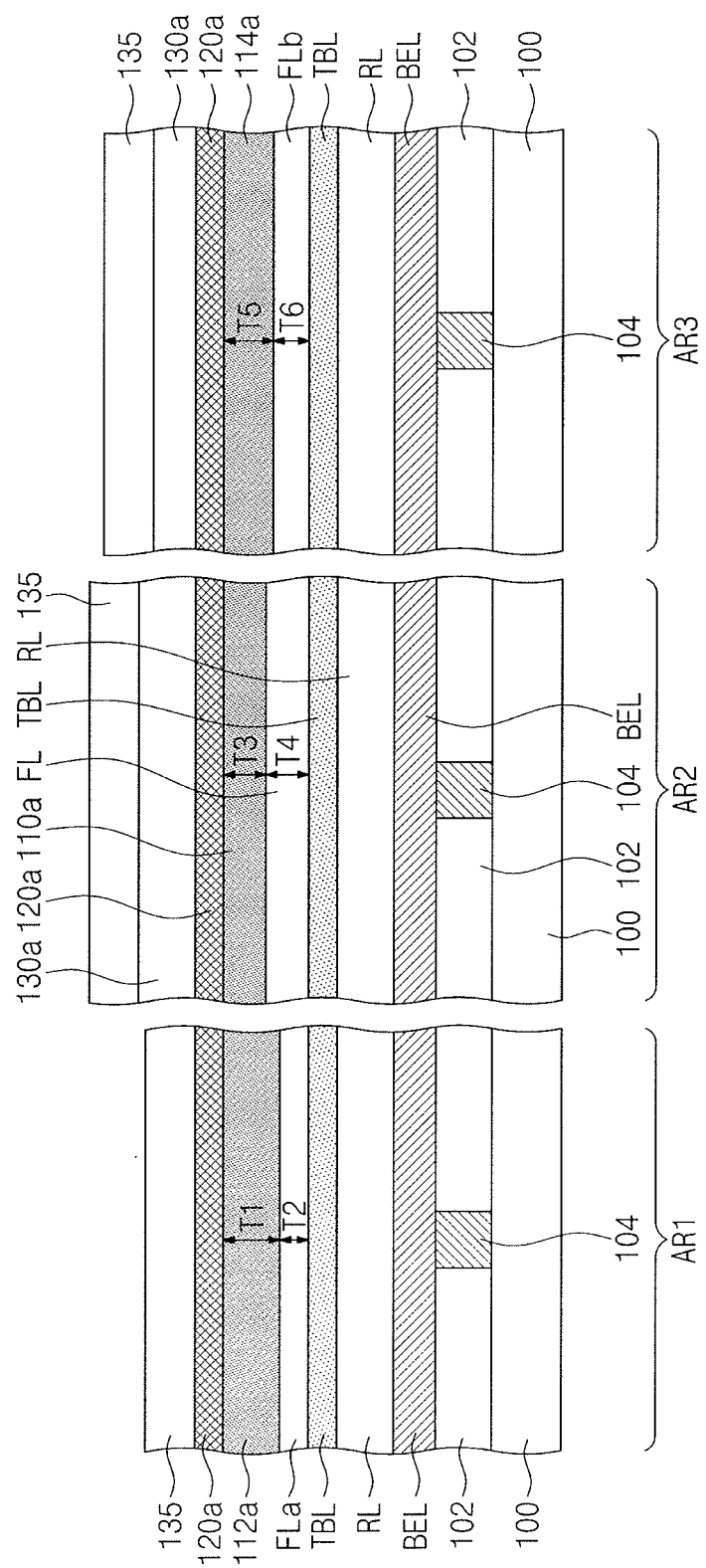

MAGNETIC MEMORY DEVICE, METHOD FOR MANUFACTURING THE SAME, AND SUBSTRATE TREATING APPARATUS

CROSS-REFERENCE TO RELATED APPLICATION

Korean Patent Application No. 10-2018-0111015, filed on Sep. 17, 2018, in the Korean Intellectual Property Office, and entitled: "Magnetic Memory Device, Method for Manufacturing the Same, and Substrate Treating Apparatus," is incorporated by reference herein in its entirety.

BACKGROUND

1. Field

Embodiments relate to a magnetic memory device, a method for manufacturing the same, and a substrate treating apparatus.

2. Description of the Related Art

As high-speed and/or low power consumption electronic devices are developed, high-speed and/or low-voltage semiconductor memory devices used therein may also be developed. Magnetic memory devices have been developed as semiconductor memory devices capable of satisfying these characteristics. The magnetic memory devices may emerge as next-generation semiconductor memory devices because of their high-speed and/or non-volatile characteristics.

A magnetic memory device may include a magnetic tunnel junction (MTJ) pattern. The magnetic tunnel junction pattern may include two magnetic layers and an insulating layer between the two magnetic layers. A resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively high resistance value. When the magnetization directions of the two magnetic layers are parallel to each other, the magnetic tunnel junction pattern may have a relatively low resistance value. The magnetic memory device may read/write data using a difference between the resistance values of the magnetic tunnel junction pattern.

SUMMARY

The embodiments may be realized by providing a magnetic device including a substrate including a first memory region and a second memory region; a first magnetic tunnel junction pattern on the first memory region, the first magnetic tunnel junction pattern including a first free pattern and a first oxide pattern on the first free pattern; and a second magnetic tunnel junction pattern on the second memory region, the second magnetic tunnel junction pattern including a second free pattern and a second oxide pattern on the second free pattern, wherein a ratio of a thickness of the first oxide pattern to a thickness of the first free pattern is different from a ratio of a thickness of the second oxide pattern to a thickness of the second free pattern.

The embodiments may be realized by providing a method for manufacturing a magnetic memory device, the method including forming a magnetic layer on a substrate; forming an oxide layer on the magnetic layer; forming a capping layer on the oxide layer; forming a first hard mask layer on the capping layer; and performing an oxidation process to control an interface property between the oxide layer and the magnetic layer, wherein the capping layer includes a first region and a second region, and wherein forming the first hard mask layer includes forming the first hard mask layer on the second region of the capping layer to expose the first region of the capping layer.

The embodiments may be realized by providing a substrate treating apparatus including an index module; a transfer module at a side of the index module; a first process chamber at a side of the transfer module; and a second process chamber at another side of the transfer module, wherein the first process chamber is configured to perform an oxidation process on a substrate, and the second process chamber is configured to perform a deposition process on the substrate on which the oxidation process is performed.

BRIEF DESCRIPTION OF THE DRAWINGS

Features will be apparent to those of skill in the art by describing in detail exemplary embodiments with reference to the attached drawings in which:

FIGS. 16 to 18 illustrate cross-sectional views of stages in a method for manufacturing the magnetic memory device of FIG. 15.

DETAILED DESCRIPTION

Figure 1:
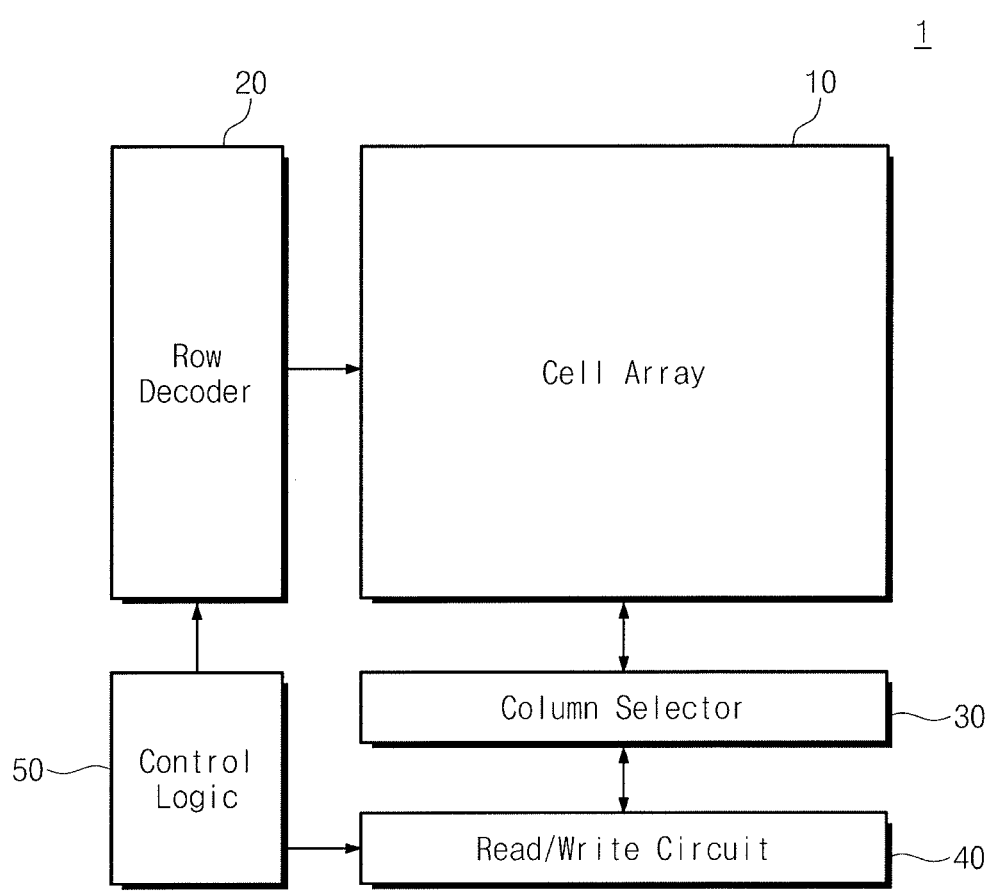
FIG. 1 illustrates a schematic block diagram of a magnetic memory device according to some embodiments.

FIG. 1 illustrates a schematic block diagram of a magnetic memory device 1 according to some embodiments.

Referring to FIG. 1, the magnetic memory device 1 may include a memory cell array 10, a row decoder 20, a column selector 30, a read/write circuit 40, and a control logic 50.

The memory cell array 10 may include a plurality of word lines and a plurality of bit lines, and memory cells may be connected to intersecting points of the word lines and the bit lines. The memory cell array 10 will be described below in more detail with reference to FIG. 2.

The row decoder 20 may be connected to the memory cell array 10 through the word lines. The row decoder 20 may decode an address signal inputted from an external system to select one among the word lines.

The column selector 30 may be connected to the memory cell array 10 through the bit lines and may decode an address signal inputted from the external system to select one among the bit lines. The bit line selected by the column selector 30 may be connected to the read/write circuit 40.

The read/write circuit 40 may provide a bit line bias for accessing a selected memory cell, in response to a control signal of the control logic 50. The read/write circuit 40 may provide a bit line voltage to the selected bit line to write/read data into/from the memory cell.

The control logic 50 may output control signals controlling the magnetic memory device 1, in response to command signals provided from the external system. The control signals outputted from the control logic 50 may control the read/write circuit 40.

Figure 2:
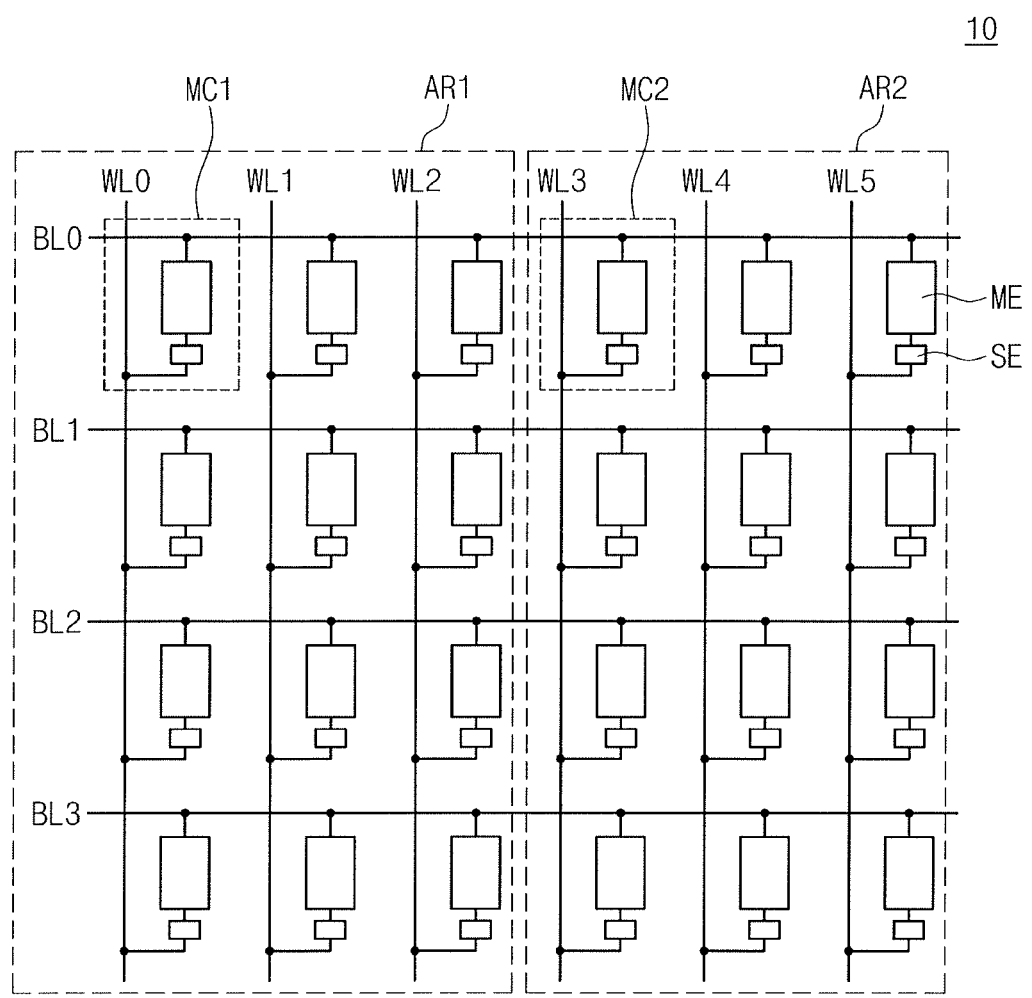
FIG. 2 illustrates a circuit diagram of a memory cell array of a magnetic memory device according to some embodiments.
Figure 3:
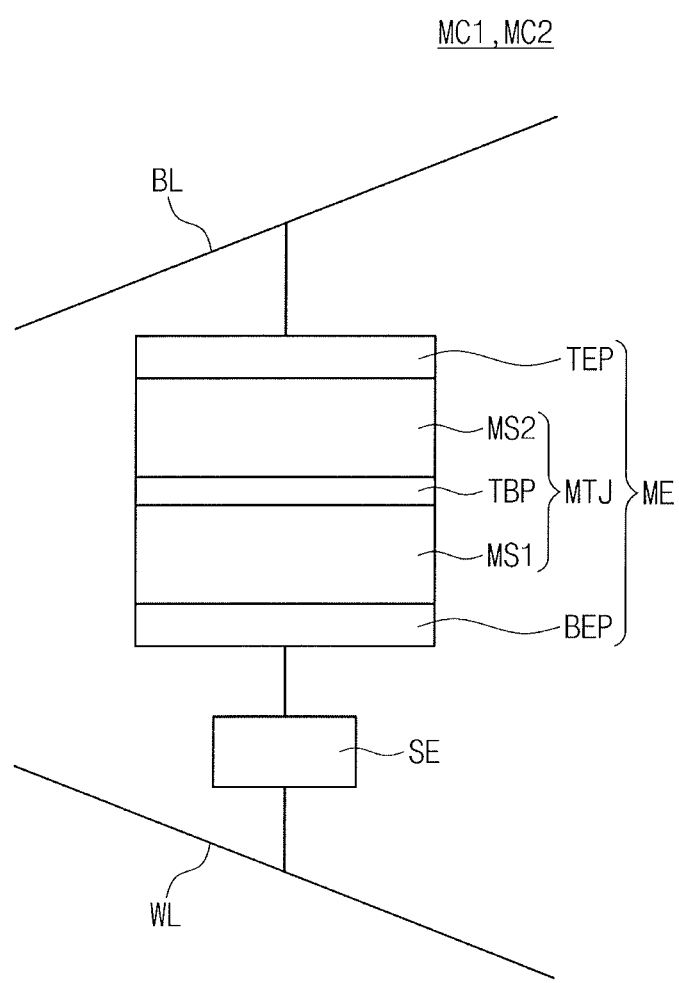
FIG. 3 illustrates a circuit diagram of a unit memory cell of a magnetic memory device according to some embodiments.

FIG. 2 illustrates a circuit diagram of a memory cell array of a magnetic memory device according to some embodiments, and FIG. 3 illustrates a circuit diagram illustrating a unit memory cell of a magnetic memory device according to some embodiments.

Referring to FIG. 2, the memory cell array 10 may include a plurality of first conductive lines, a plurality of second conductive lines, and a plurality of unit memory cells MC1 and MC2. The first conductive lines may be word lines WL0 to WL5, and the second conductive lines may be bit lines BL0 to BL3. The unit memory cells MC1 and MC2 may be two-dimensionally or three-dimensionally arranged. Each of the unit memory cells MC1 and MC2 may be connected between a corresponding one of the word lines WL0 to WL5 and a corresponding one of the bit lines BL0 to BL3. Each of the word lines WL0 to WL5 may be connected to a plurality of the unit memory cells MC1 or MC2. The unit memory cells MC1 or MC2 connected to each of the word lines WL0 to WL5 may be connected to the bit lines BL0 to BL3, respectively, and the unit memory cells MC1 and MC2 connected to each of the bit lines BL0 to BL3 may be connected to the word lines WL0 to WL5, respectively. Each of the unit memory cells MC1 or MC2 connected to each of the word lines WL0 to WL5 may be connected to the read/write circuit 40 of FIG. 1 through each of the bit lines BL0 to BL3.

The memory cell array 10 may include a first memory region AR1 and a second memory region AR2. The first memory region AR1 may be a partial memory region of the memory cell array 10, and the second memory region AR2 may be another partial memory region of the memory cell array 10. The first memory region AR1 may include first memory cells MC1, and the second memory region AR2 may include second memory cells MC2. Hereinafter, the first memory region AR1 will be referred to as a first region AR1, and the second memory region AR2 will be referred to as a second region AR2. The first region AR1 and the second region AR2 may function as different applications from each other.

Referring to FIG. 3, each of the unit memory cells MC1 and MC2 may include a memory element ME and a selection element SE. The memory element ME may be connected between a bit line BL and the selection element SE, and the selection element SE may be connected between the memory element ME and a word line WL. The memory element ME may be a variable resistance element of which a resistance state is switchable between two different resistance states by an electrical pulse applied thereto.

In an implementation, the memory element ME may have a thin layer structure of which an electrical resistance is changeable using spin transfer torque of electrons of a current passing therethrough. The memory element ME may have a thin layer structure showing a magnetoresistance characteristic and may include at least one ferromagnetic material and/or at least one anti-ferromagnetic material.

The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line may be connected to the selection element SE.

In an implementation, the memory element ME may include a first magnetic structure MS1, a second magnetic structure MS2, and a tunnel barrier pattern TBP between the first and second magnetic structures MS1 and MS2. The first magnetic structure MS1, the second magnetic structure MS2 and the tunnel barrier pattern TBP may constitute a magnetic tunnel junction pattern MTJ. Each of the first and second magnetic structures MS1 and MS2 may include at least one magnetic layer formed of a magnetic material. The memory element ME may further include a bottom electrode pattern BEP and a top electrode pattern TEP. The bottom electrode pattern BEP may be between the first magnetic structure MS1 and the selection element SE, and the top electrode pattern TEP may be between the second magnetic structure MS2 and the bit line BL.

Figure 4:
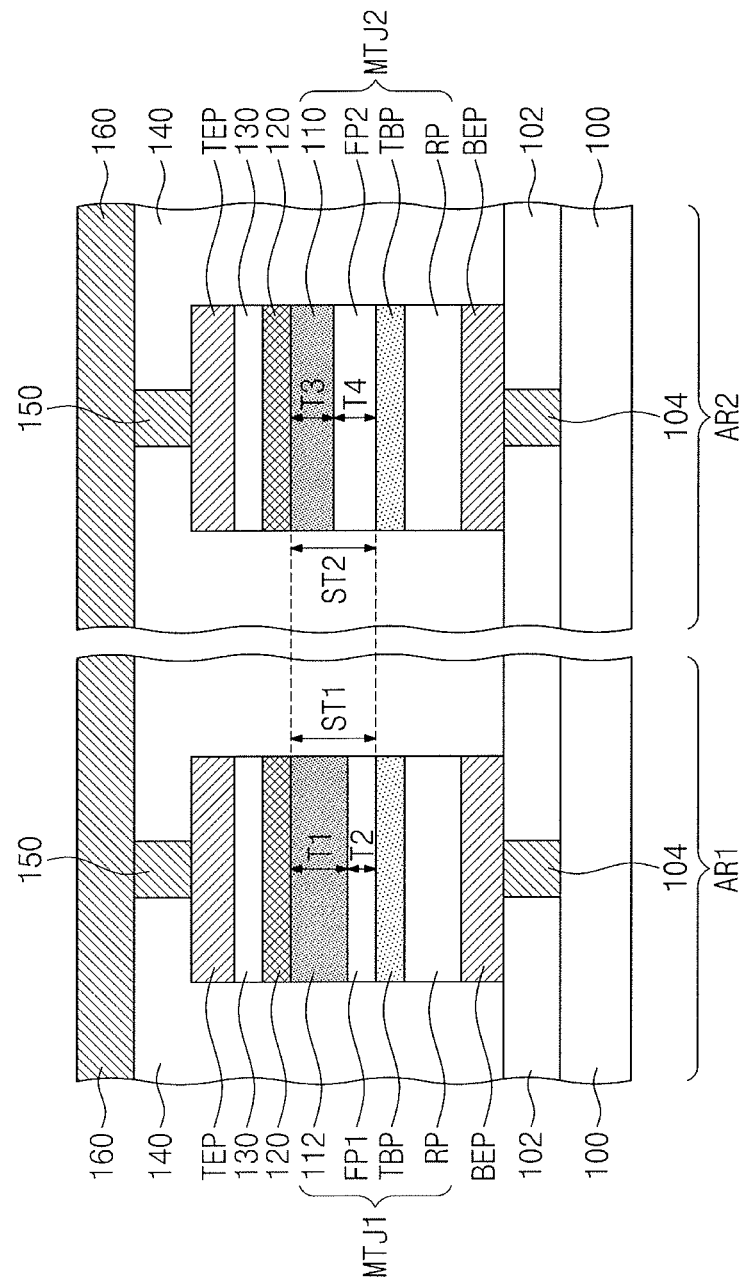
FIG. 4 illustrates a cross-sectional view of a magnetic memory device according to some embodiments.

FIG. 4 illustrates a cross-sectional view of a magnetic memory device according to some embodiments. Referring to FIG. 4, a lower interlayer insulating layer 102 may be on a substrate 100. The substrate 100 may be a semiconductor substrate that includes, e.g., silicon, silicon on an insulator (SOI), silicon-germanium (SiGe), germanium (Ge), or gallium-arsenic (GaAs). In an implementation, the substrate 100 may be a system-on-chip. The substrate 100 may include a first region AR1 and a second region AR2.

Selection elements may be on the substrate 100, and the lower interlayer insulating layer 102 may cover the selection elements. The selection elements may be field effect transistors or diodes. The lower interlayer insulating layer 102 may include at least one of an oxide layer, a nitride layer, or an oxynitride layer.

Lower contact plugs 104 may be in the lower interlayer insulating layer 102. Each of the lower contact plugs 104 may penetrate the lower interlayer insulating layer 102 to be electrically connected to one terminal of a corresponding one of the selection elements. In an implementation, top surfaces of the lower contact plugs 104 may be substantially coplanar with a top surface of the lower interlayer insulating layer 102.

A bottom electrode pattern BEP, a magnetic tunnel junction pattern MTJ1 or MTJ2, and a top electrode pattern TEP may be sequentially stacked on the lower interlayer insulating layer 102. The bottom electrode pattern BEP may be electrically connected to the top surface of each of the lower contact plugs 104. Sidewalls of the bottom electrode pattern BEP, the magnetic tunnel junction pattern MTJ1 or MTJ2 and the top electrode pattern TEP may be aligned with each other. In an implementation, the sidewalls of the bottom electrode pattern BEP, the magnetic tunnel junction pattern MTJ1 or MTJ2 and the top electrode pattern TEP may have a sloped or inclined profile. The bottom electrode pattern BEP may include a conductive material. For example, the bottom electrode pattern BEP may include a conductive metal nitride such as titanium nitride and/or tantalum nitride. In an implementation, the top electrode pattern TEP may include a conductive material. For example, the top electrode pattern TEP may include a metal (e.g., tantalum (Ta), aluminum (Al), copper (Cu), gold (Au), silver (Ag), or titanium (Ti)) or a conductive metal nitride (e.g., tantalum nitride (TaN) or titanium nitride (TiN)).

A first magnetic tunnel junction pattern MTJ1 may be on the first region AR1. The first magnetic tunnel junction pattern MTJ1 may include a pinned pattern RP, a first free pattern FP1, a tunnel barrier pattern TBP (between the pinned pattern RP and the first free pattern FP1), and a first oxide pattern 112. The first free pattern FP1 may be between the top electrode pattern TEP and the tunnel barrier pattern TBP, and the pinned pattern RP may be between the bottom electrode pattern BEP and the tunnel barrier pattern TBP. The first oxide pattern 112 may be spaced apart from the tunnel barrier pattern TBP with the first free pattern FP1 therebetween. The first oxide pattern 112 may be between the first free pattern FP1 and the top electrode pattern TEP.

A second magnetic tunnel junction pattern MTJ2 may be on the second region AR2. The second magnetic tunnel junction pattern MTJ2 may include a pinned pattern RP, a second free pattern FP2, a tunnel barrier pattern TBP (between the pinned pattern RP and the second free pattern FP2), and a second oxide pattern 110. The second free pattern FP2 may be between the top electrode pattern TEP and the tunnel barrier pattern TBP, and the pinned pattern RP may be between the bottom electrode pattern BEP and the tunnel barrier pattern TBP. The second oxide pattern 110 may be spaced apart from the tunnel barrier pattern TBP with the second free pattern FP2 therebetween. The second oxide pattern 110 may be between the second free pattern FP2 and the top electrode pattern TEP.

The first and second free patterns FP1 and FP2 may each include a material having interface perpendicular magnetic anisotropy. The interface perpendicular magnetic anisotropy refers to a phenomenon that a magnetic layer having an intrinsic horizontal magnetization property has a perpendicular magnetization direction by an influence of an interface between the magnetic layer and another layer adjacent to the magnetic layer. For example, the intrinsic horizontal magnetization property may mean that a magnetic layer has a magnetization direction parallel to the widest surface of the magnetic layer when an external factor does not exist. For example, when the magnetic layer having the intrinsic horizontal magnetization property is formed on a substrate and an external factor does not exist, the magnetization direction of the magnetic layer may be substantially parallel to a top surface of the substrate. For example, the first and second free patterns FP1 and FP2 may have magnetization directions substantially parallel to the widest surfaces thereof when an external factor does not exist. The intrinsic horizontal magnetization property may be realized or shown by a single-layered or multi-layered structure including at least one of cobalt (Co), iron (Fe), or any alloy thereof. In an implementation, each of the first and second free patterns FP1 and FP2 may include cobalt (Co), iron (Fe), and a first non-metal element. The first non-metal element may be, e.g., boron (B). In an implementation, each of the first and second free patterns FP1 and FP2 may have a single-layered structure of, e.g., CoFeB.

The first and second oxide patterns 112 and 110 may each include a metal oxide. The first and second oxide patterns 112 and 110 may each include a non-magnetic metal element and an oxygen element. For example, the non-magnetic metal element may include at least one of Ta, Ti, Mg, Hf, Zr, W, or Mo.

A ratio of a thickness T1 of the first oxide pattern 112 to a thickness T2 of the first free pattern FP1 may be different from a ratio of a thickness T3 of the second oxide pattern 110 to a thickness T4 of the second free pattern FP2. In an implementation, the ratio of the thickness T1 of the first oxide pattern 112 to the thickness T2 of the first free pattern FP1 may be greater than the ratio of the thickness T3 of the second oxide pattern 110 to the thickness T4 of the second free pattern FP2. For example, the ratio of the thickness T1 of the first oxide pattern 112 to the thickness T2 of the first free pattern FP1 may be 1.2:0.8, and the ratio of the thickness T3 of the second oxide pattern 110 to the thickness T4 of the second free pattern FP2 may be 0.8:1.2. A sum ST1 of the thickness T1 of the first oxide pattern 112 and the thickness T2 of the first free pattern FP1 may be equal to a sum ST2 of the thickness T3 of the second oxide pattern 110 and the thickness T4 of the second free pattern FP2.

The first free pattern FP1 may be in contact with (e.g., may directly contact) the first oxide pattern 112. The second free pattern FP2 may be in contact with (e.g., may directly contact) the second oxide pattern 110. An oxygen concentration of the first oxide pattern 112 may be higher than an oxygen concentration of the second oxide pattern 110. In an implementation, the oxygen concentration of each of the oxide patterns 110 and 112 may be defined as a value obtained by converting a ratio of the number of oxygen atoms to the total number of atoms in each oxide pattern 110 or 112 into a percentage (e.g., atom %).

The tunnel barrier pattern TBP may include, e.g., magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). For example, the tunnel barrier pattern TBP may be formed of magnesium oxide (MgO). In an implementation, the tunnel barrier pattern TBP may include a plurality of layers, and each of the plurality of layers may include, e.g., magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN).

The pinned pattern RP may include a ferromagnetic material. In an implementation, the pinned pattern RP may include a plurality of layers, and at least one of the plurality of layers may include the ferromagnetic material.

Figure 5A:
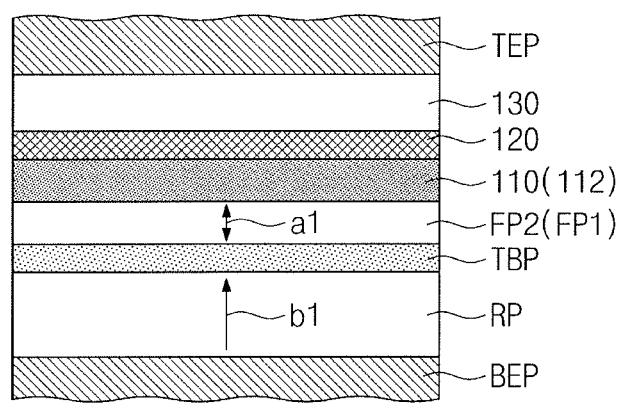
FIG. 5A illustrates a cross-sectional view of an example of a magnetic tunnel junction pattern of FIG. 4.
Figure 5B:
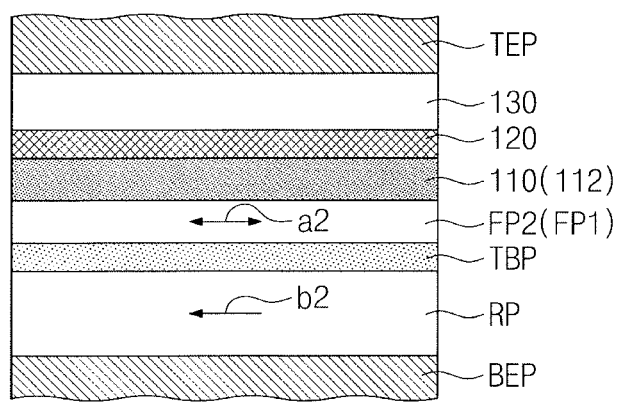
FIG. 5B illustrates a cross-sectional view of an example of the magnetic tunnel junction pattern of FIG. 4.

FIG. 5A illustrates a cross-sectional view of an example of a magnetic tunnel junction pattern of FIG. 4, and FIG. 5B illustrates a cross-sectional view of another example of the magnetic tunnel junction pattern of FIG. 4.

In an implementation, as illustrated in FIG. 5A, the free pattern FP1 or FP2 may be a free layer having a changeable magnetization direction a1. The pinned pattern RP may include at least one pinned layer having a magnetization direction b1 fixed in one direction. The magnetization directions a1 and b1 may be substantially perpendicular to a contact surface of the free pattern FP1 or FP2 and the tunnel barrier pattern TBP.

In this case, the free pattern FP1 or FP2 may have an extrinsic perpendicular magnetization property in which an intrinsic horizontal magnetization property is changed into a perpendicular magnetization property by an external factor. For example, the free pattern FP1 or FP2 may be in contact with the tunnel barrier pattern TBP and may have an extrinsic perpendicular magnetization property by magnetic anisotropy induced by the contact of the free pattern FP1 or FP2 and the tunnel barrier pattern TBP. For example, when the tunnel barrier pattern TBP includes MgO and the free pattern FP1 or FP2 includes CoFeB, the magnetic anisotropy may be induced due to combination of an iron (Fe) element of the free pattern FP1 or FP2 with oxygen of the tunnel barrier pattern TBP. In addition, the free pattern FP1 or FP2 may be in contact with the oxide pattern 112 or 110 and may have an extrinsic perpendicular magnetization property by magnetic anisotropy induced by the contact of the free pattern FP1 or FP2 and the oxide pattern 112 or 110. For example, when the oxide pattern 112 or 110 includes TaOx and the free pattern FP1 or FP2 includes CoFeB, the magnetic anisotropy may be induced due to combination of an iron (Fe) element of the free pattern FP1 or FP2 with oxygen of the oxide pattern 112 or 110.

The pinned pattern RP may include at least one pinned layer having a perpendicular magnetization direction b1. The pinned layer may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

In an implementation, as illustrated in FIG. 5B, the free pattern FP1 or FP2 may be a free layer having a changeable magnetization direction a2. The pinned pattern RP may include at least one pinned layer having a magnetization direction b2 fixed in one direction. The magnetization directions a2 and b2 may be substantially parallel to the contact surface of the free pattern FP1 or FP2 and the tunnel barrier pattern TBP. In this case, e.g., the free pattern FP1 or FP2 may have a predetermined thickness capable of providing the horizontal magnetization direction a2. The pinned pattern RP may include at least one pinned layer having the horizontal magnetization direction b2. The pinned layer may include a ferromagnetic material and may further include an anti-ferromagnetic material for pinning a magnetization direction of the ferromagnetic material.

In an implementation, the ratio of the thickness T1 of the first oxide pattern 112 to the thickness T2 of the first free pattern FP1 may be greater than the ratio of the thickness T3 of the second oxide pattern 110 to the thickness T4 of the second free pattern FP2. In addition, the oxygen concentration of the first oxide pattern 112 may be higher than the oxygen concentration of the second oxide pattern 110. Thus, a switching characteristic of the first magnetic tunnel junction pattern MTJ1 may be different from that of the second magnetic tunnel junction pattern MTJ2. For example, a switching current to change the magnetization direction of the first free pattern FP1 of the first magnetic tunnel junction pattern MTJ1 may be different from a switching current to change the magnetization direction of the second free pattern FP2 of the second magnetic tunnel junction pattern MTJ2. For example, the first magnetic tunnel junction pattern MTJ1 may have a higher retention characteristic than the second magnetic tunnel junction pattern MTJ2, and the second magnetic tunnel junction pattern MTJ2 may be more easily switched than the first magnetic tunnel junction pattern MTJ1.

Thus, the first magnetic tunnel junction pattern MTJ1 on the first region AR1 and the second magnetic tunnel junction pattern MTJ2 on the second region AR2 may function as or perform different applications from each other. For example, the first magnetic tunnel junction pattern MTJ1 on the first region AR1 may function as a non-volatile memory (NVM) cell MC1 of FIG. 2, and the second magnetic tunnel junction pattern MTJ2 on the second region AR2 may function as a random access memory (RAM) cell MC2 of FIG. 2. As a result, the memory cells performing different functions may be formed on the substrate 100 by adjusting the thicknesses of the first and second oxide patterns 112 and 110 and the free patterns FP1 and FP2 of the magnetic tunnel junction patterns MTJ1 and MTJ2, without forming different kinds of memory elements on the substrate 100.

Referring again to FIG. 4, a capping pattern 120 may be on each of the first and second oxide patterns 112 and 110. The capping pattern 120 may include a metal oxide. For example, the capping pattern 120 may include tantalum oxide, magnesium oxide, titanium oxide, zirconium oxide, hafnium oxide, or zinc oxide.

A mask pattern 130 may be on the capping pattern 120. The mask pattern 130 may include a material of which an oxygen affinity is higher than that of the capping pattern 120. For example, the mask pattern 130 may include copper, tungsten, titanium, tantalum, aluminum, or a metal nitride (e.g., titanium nitride or tantalum nitride).

An upper interlayer insulating layer 140 may be on the lower interlayer insulating layer 102 to cover the bottom electrode patterns BEP, the magnetic tunnel junction patterns MTJ1 and MTJ2, and the top electrode patterns TEP. Upper contact plugs 150 may penetrate the upper interlayer insulating layer 140 to be connected to the top electrode patterns TEP, respectively. The upper interlayer insulating layer 140 may include an oxide layer, a nitride layer, and/or an oxynitride layer, and the upper contact plugs 150 may include a metal (e.g., titanium, tantalum, copper, aluminum, or tungsten) or a conductive metal nitride (e.g., titanium nitride or tantalum nitride). An interconnection line 160 may be on the upper interlayer insulating layer 140. The interconnection line 160 may be connected to the upper contact plug 150. The interconnection line 160 may include a metal (e.g., titanium, tantalum, copper, aluminum, or tungsten) or a conductive metal nitride (e.g., titanium nitride or tantalum nitride). In an implementation, the interconnection line 160 may be a bit line.

Figure 6:
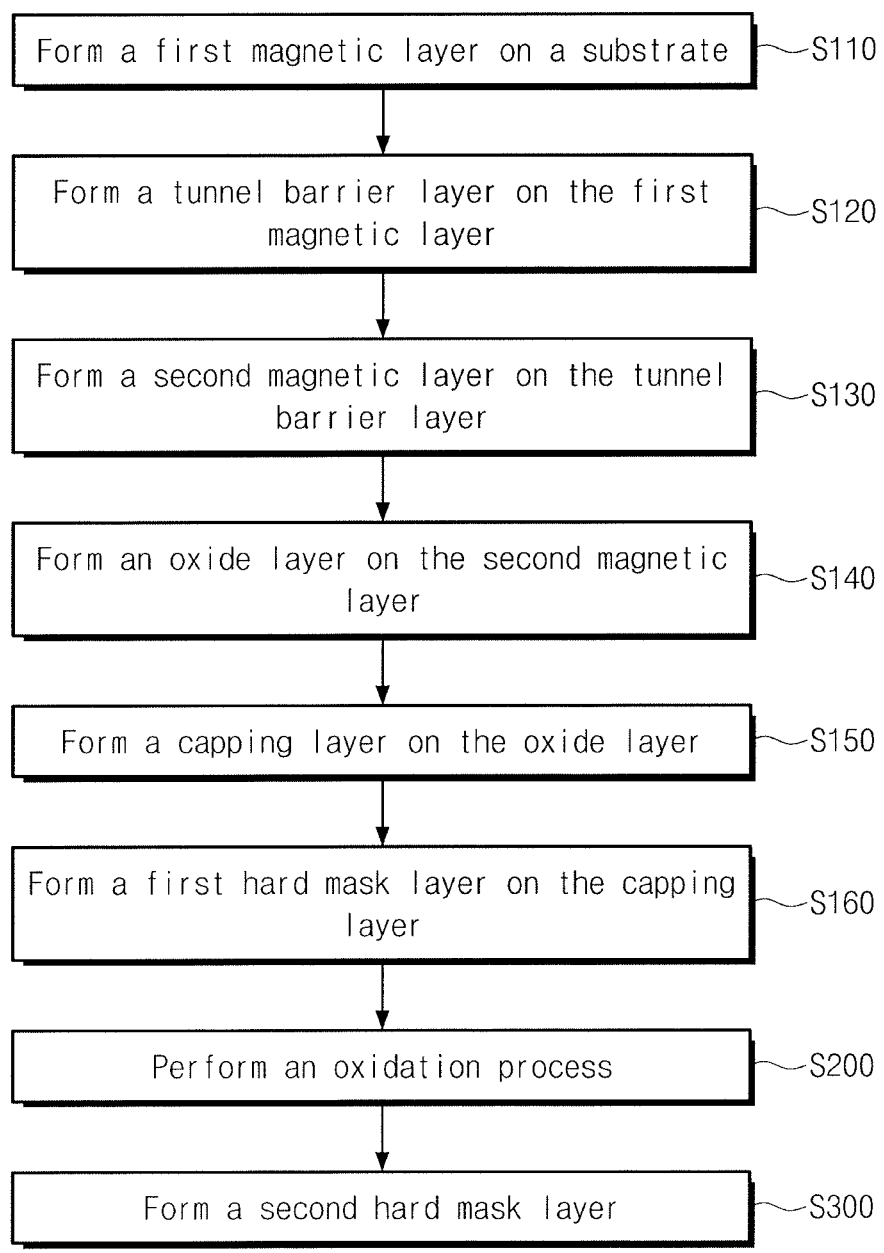
FIG. 6 illustrates a flowchart of a method for manufacturing a magnetic memory device according to some embodiments.
Figure 7:
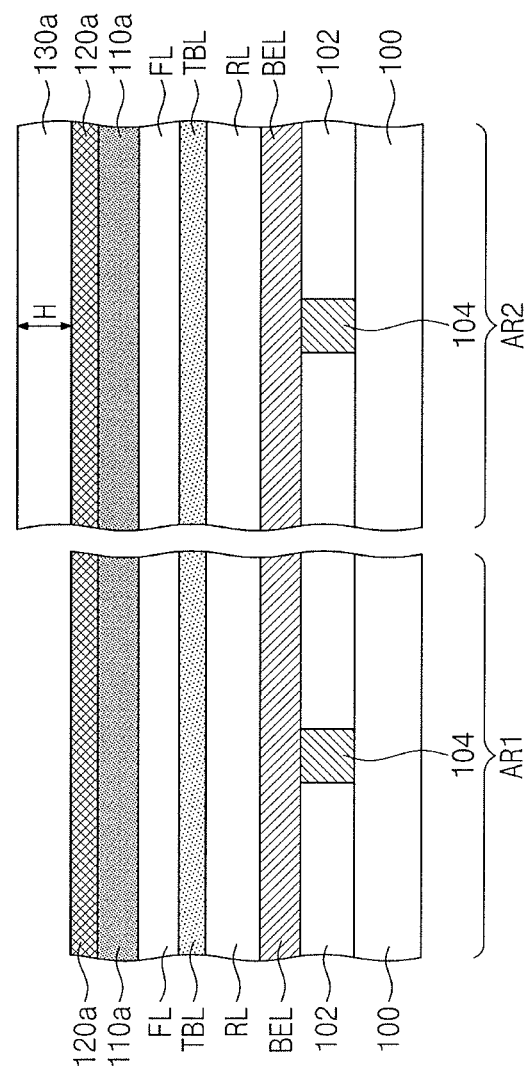
FIGS. 7 to 9 illustrate cross-sectional views of stages in a method for manufacturing a magnetic memory device according to some embodiments.
Figure 8:
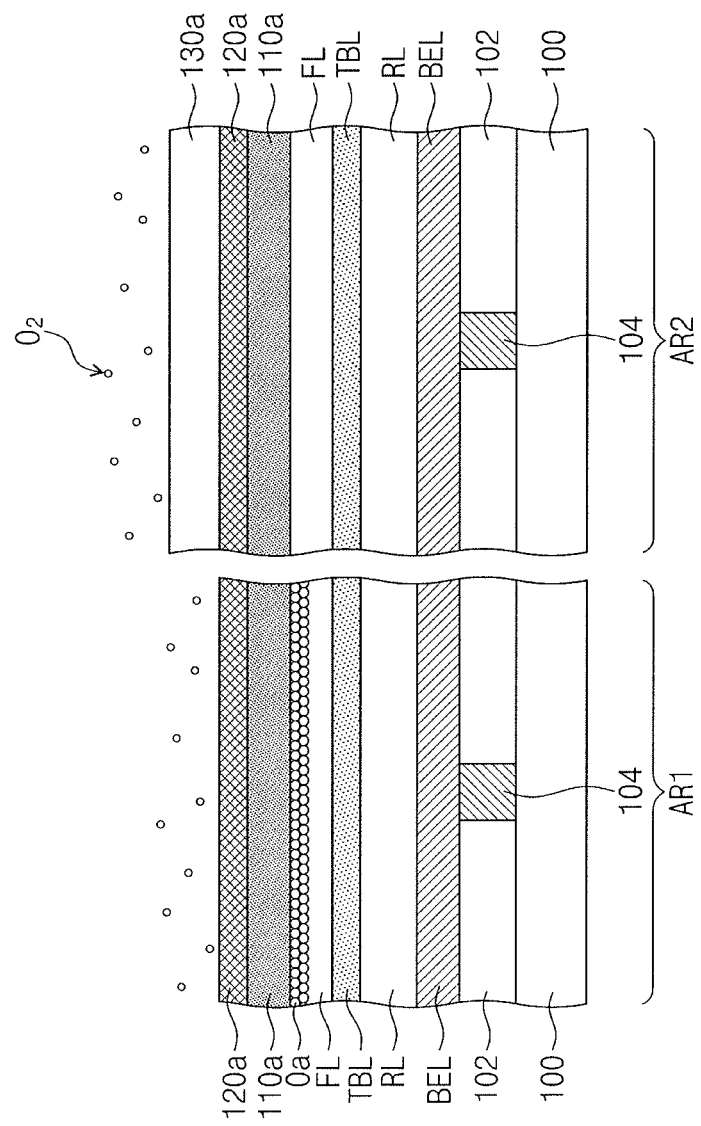
Figure 9:
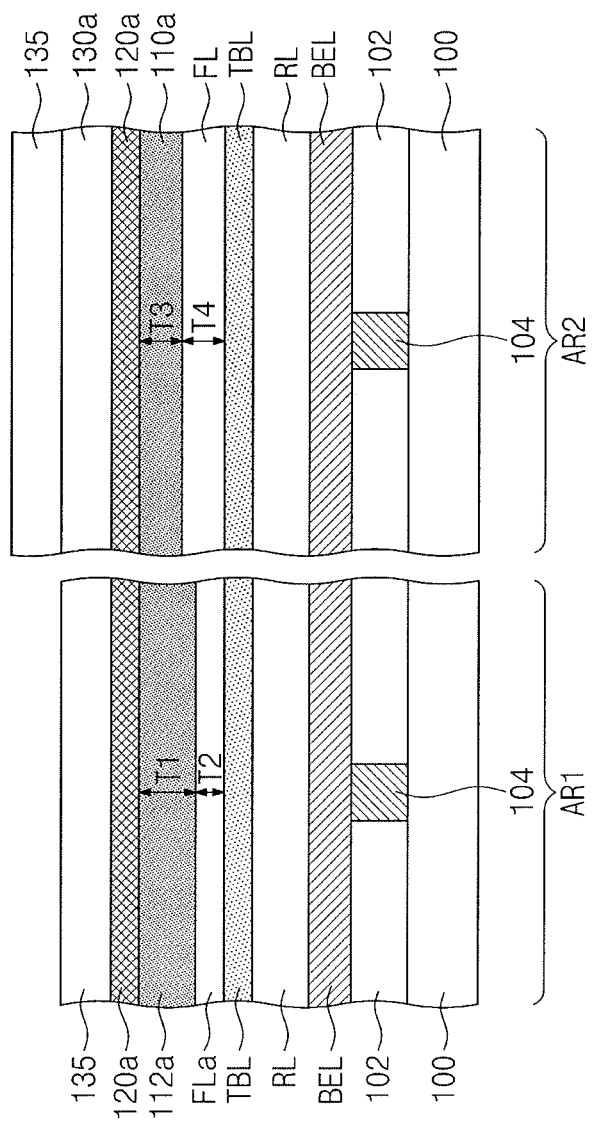

FIG. 6 illustrates a flowchart of a method for manufacturing a magnetic memory device according to some embodiments. FIGS. 7 to 9 illustrate cross-sectional views of stages in a method for manufacturing a magnetic memory device according to some embodiments.

Referring to FIGS. 6 and 7, a lower interlayer insulating layer 102 may be formed on a substrate 100 (including a first region AR1 and a second region AR2). The substrate 100 may include a semiconductor substrate. For example, the substrate 100 may include a silicon substrate, a germanium substrate, or a silicon-germanium substrate. In an implementation, the substrate 100 may be a part of a system-onchip. In an implementation, selection elements may be formed on the substrate 100, and the lower interlayer insulating layer 102 may be formed to cover the selection elements. The selection elements may be field effect transistors. In an implementation, the selection elements may be diodes. The lower interlayer insulating layer 102 may be formed of a single layer or multi-layer including an oxide layer (e.g., a silicon oxide layer), a nitride layer (e.g., a silicon nitride layer), or an oxynitride layer (e.g., a silicon oxynitride layer). Lower contact plugs 104 may be formed in the lower interlayer insulating layer 102. Each of the lower contact plugs 104 may penetrate the lower interlayer insulating layer 102 to be electrically connected to one terminal of a corresponding one of the selection elements. The lower contact plugs 104 may include a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

A bottom electrode layer BEL may be formed on the lower interlayer insulating layer 102. The bottom electrode layer BEL may include a conductive metal nitride such as titanium nitride and/or tantalum nitride. In an implementation, the bottom electrode layer BEL may include a material (e.g., ruthenium (Ru)) capable of assisting crystal growth of magnetic layers to be formed thereon. The bottom electrode layer BEL may be formed by a sputtering method, a chemical vapor deposition (CVD) method, or an atomic layer deposition (ALD) method.

A first magnetic layer RL may be formed on the bottom electrode layer BEL (S110). Subsequently, a tunnel barrier layer TBL may be formed on the first magnetic layer RL (S120). A second magnetic layer FL may be formed on the tunnel barrier layer TBL (S130).

The first magnetic layer RL may include at least one pinned layer having a magnetization direction fixed in one direction. In an implementation, the magnetization direction of the pinned layer may be substantially perpendicular to an interface between the tunnel barrier layer TBL and the first magnetic layer RL. In this case, the pinned layer may include a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. In an implementation, the magnetization direction of the pinned layer may be substantially parallel to the interface between the tunnel barrier layer TBL and the first magnetic layer RL. In this case, the pinned layer may include a ferromagnetic material. The pinned layer may further include an antiferromagnetic material for pinning a magnetization direction of the ferromagnetic material included in the pinned layer.

The tunnel barrier layer TBL may include, e.g., a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

The second magnetic layer FL may be a free layer that has a magnetization direction changeable to be parallel or antiparallel to the fixed magnetization direction of the pinned layer. The second magnetic layer FL may include a magnetic material having an intrinsic horizontal magnetization property. The intrinsic horizontal magnetization property may be realized or shown by a single-layered or multi-layered structure including at least one of cobalt (Co), iron (Fe), or any alloy thereof. In an implementation, the second magnetic layer FL may include, e.g., cobalt (Co), iron (Fe), and a first non-metal element. The first non-metal element may be, e.g., boron (B). For example, the second magnetic layer FL may have a single-layered structure of CoFeB. In an implementation, the magnetization direction of the second magnetic layer FL may be substantially perpendicular to an interface between the tunnel barrier layer TBL and the second magnetic layer FL. In this case, the second magnetic layer FL may have an extrinsic perpendicular magnetization property in which the intrinsic horizontal magnetization property is changed into a perpendicular magnetization property by an external factor, as described with reference to FIG. 5A. In an implementation, the magnetization direction of the second magnetic layer FL may be substantially parallel to the interface between the tunnel barrier layer TBL and the second magnetic layer FL, as described with reference to FIG. 5B.

Each of the first magnetic layer RL, the tunnel barrier layer TBL and the second magnetic layer FL may be formed by an ALD method, a physical vapor deposition (PVD) method, or a CVD method.

An oxide layer 110a may be formed on the second magnetic layer FL (S140). The formation of the oxide layer 110a may include forming a metal layer on the second magnetic layer FL, and performing an oxidation process on the metal layer to form the oxide layer 110a. The metal layer may be formed using, e.g., a sputtering deposition process. The oxidation process may be performed using, e.g., a natural oxidation method. The oxide layer 110a may be, e.g., a tantalum oxide (TaOx) layer. In an implementation, at least a portion of the oxide layer 110a may be amorphous.

A capping layer 120a may be formed on the oxide layer 110a (S150). The capping layer 120a may induce the second magnetic layer FL to have the magnetization direction substantially perpendicular to a top surface of the substrate 100. For example, the second magnetic layer FL may have interface perpendicular magnetic anisotropy (iPMA). The capping layer 120a may include a metal oxide.

A first hard mask layer 130a may be formed on (e.g., a part of) the capping layer 120a (S160). The first hard mask layer 130a may not be formed on the first region AR1 but may be formed on the second region AR2. The capping layer 120a on the first region AR1 may be exposed (e.g., uncovered by the first hard mask layer 130a), and the capping layer 120a on the second region AR2 may be covered by the first hard mask layer 130a. For example, the first hard mask layer 130a may be formed on a partial region or part of the substrate 100. A thickness H of the first hard mask layer 130a on the second region AR2 may range from about 1 Å to about 1,000 Å. The first hard mask layer 130a may be formed using an ALD method, a PVD method, or a CVD method. The formation of the first hard mask layer 130a on the partial region (e.g., the second region AR2) of the substrate 100 may be performed by a selective deposition method, an etching method after deposition, and/or a lift-off method. In an implementation, a photoresist layer may be coated on an entire top surface of the substrate 100, and then, a portion of the photoresist layer may be removed by exposure and development processes. Thereafter, a hard mask layer may be deposited, and then, a remaining photoresist layer and a portion of the hard mask layer may be removed to form the first hard mask layer 130a.

The first hard mask layer 130a may include a material of which an oxygen affinity is higher than that of the capping layer 120a. For example, the first hard mask layer 130a may include copper, tungsten, titanium, tantalum, aluminum, a nitride thereof, an oxide thereof, or a boride thereof.

In an implementation, forming the first magnetic layer RL on the substrate 100 (S110), forming the tunnel barrier layer TBL on the first magnetic layer RL (S120), forming the second magnetic layer FL on the tunnel barrier layer TBL (S130), forming the oxide layer 110a on the second magnetic layer FL (S140), forming the capping layer 120a on the oxide layer 110a (S150), and forming the first hard mask layer 130a on the capping layer 120a may be performed in the same chamber.

Referring to FIGS. 6 and 8, an oxidation process may be performed (S200). The oxidation process may be performed by thermally treating the substrate 100. At this time, the oxidation process may be performed at a temperature of 50° C. to 600° C. The oxidation process may be performed at a pressure of an ultra-high vacuum ($1E^{-10}$ torr) to atmospheric pressure. An interface property between the oxide layer 110a and the second magnetic layer FL may be controlled by the oxidation process performed at a high temperature. Oxygen atoms Oa in the oxide layer 110a of the first region AR1 may be diffused to an interface of the oxide layer 110a and the second magnetic layer FL. Diffusion of oxygen atoms in the oxide layer 110a of the second region AR2 may be inhibited or prevented by the first hard mask layer 130a.

At this time, an oxygen ($O_2$) gas may be supplied to control an oxygen concentration. For example, the oxygen concentration in a process chamber may range from 0.001% to 100% (e.g., volume %). The oxygen ($O_2$) gas may be additionally supplied to promote movement of the oxygen atoms Oa in the oxide layer 110a of the first region AR1.

Referring to FIGS. 6 and 9, the oxygen atoms Oa (see FIG. 8) in the oxide layer 110a (see FIG. 8) of the first region AR1 may be diffused, and thus an oxide layer 112a of the first region AR1 may be expanded. For example, a size of a second magnetic layer FLa of the first region AR1 may be relatively reduced. For example, a thickness T1 of the oxide layer 112a of the first region AR1 may be increased as compared with a thickness T3 of the oxide layer 110a of the second region AR2, and a thickness T2 of the second magnetic layer FLa of the first region AR1 may be reduced as compared with a thickness T4 of the second magnetic layer FL of the second region AR2.

Thereafter, a second hard mask layer 135 may be formed on the first region AR1 and the second region AR2 (S300). The second hard mask layer 135 may be deposited on the capping layer 120a of the first region AR1 and the first hard mask layer 130a of the second region AR2. The second hard mask layer 135 may be formed using an ALD method, a PVD method, or a CVD method. The second hard mask layer 135 may include the same material as the first hard mask layer 130a. For example, the second hard mask layer 135 may include copper, tungsten, titanium, tantalum, aluminum, a nitride thereof, an oxide thereof, or a boride thereof. The second hard mask layer 135 may protect underlying layers from subsequent processes.

The oxidation process and the formation of the second hard mask layer 135 may be performed in-situ in the same apparatus. The oxidation process of the high temperature and the formation of the second hard mask layer 135 may be performed under an ultra-high vacuum, and thus they may be performed in-situ to maintain a process environment constantly.

Referring again to FIG. 4, thereafter, the first and second hard mask layers 130a and 135 may be planarized, and conductive mask patterns may be formed on the planarized hard mask layer. For example, the conductive mask patterns may include tungsten, titanium, tantalum, aluminum, or a metal nitride (e.g., titanium nitride or tantalum nitride). The conductive mask patterns may define regions in which magnetic tunnel junction patterns will be formed.

The planarized hard mask layer, the capping layer 120a, the oxide layers 112a and 110a, the second magnetic layers FLa and FL, the tunnel barrier layer TBL, the first magnetic layer RL, and the bottom electrode layer BEL may be sequentially etched using the conductive mask patterns as etch masks. The etching process may be performed using an ion beam etching process. The planarized hard mask layer, the capping layer 120a, the oxide layers 112a and 110a, the second magnetic layers FLa and FL, the tunnel barrier layer TBL, the first magnetic layer RL, and the bottom electrode layer BEL may be sequentially etched to form mask patterns 130, capping patterns 120, first and second oxide patterns 112 and 110, free patterns FP1 and FP2, tunnel barrier patterns TBP, pinned patterns RP, and bottom electrode patterns BEP, respectively. After the etching process, the conductive mask patterns may be defined as top electrode patterns TEP.

The pinned pattern RP, the tunnel barrier pattern TBP, the first free pattern FP1 and the first oxide pattern 112 on the first region AR1 may constitute a first magnetic tunnel junction pattern MTJ1. The pinned pattern RP, the tunnel barrier pattern TBP, the second free pattern FP2 and the second oxide pattern 110 on the second region AR2 may constitute a second magnetic tunnel junction pattern MTJ2. A ratio of the thickness T1 of the first oxide pattern 112 to the thickness T2 of the first free pattern FP1 may be greater than a ratio of the thickness T3 of the second oxide pattern 110 to the thickness T4 of the second free pattern FP2. In addition, an oxygen concentration of the first oxide pattern 112 may be higher than an oxygen concentration of the second oxide pattern 110. Thus, a switching characteristic of the first magnetic tunnel junction pattern MTJ1 may be different from that of the second magnetic tunnel junction pattern MTJ2. For example, a switching current to change the magnetization direction of the first free pattern FP1 of the first magnetic tunnel junction pattern MTJ1 may be different from a switching current to change the magnetization direction of the second free pattern FP2 of the second magnetic tunnel junction pattern MTJ2.

Figure 10A:
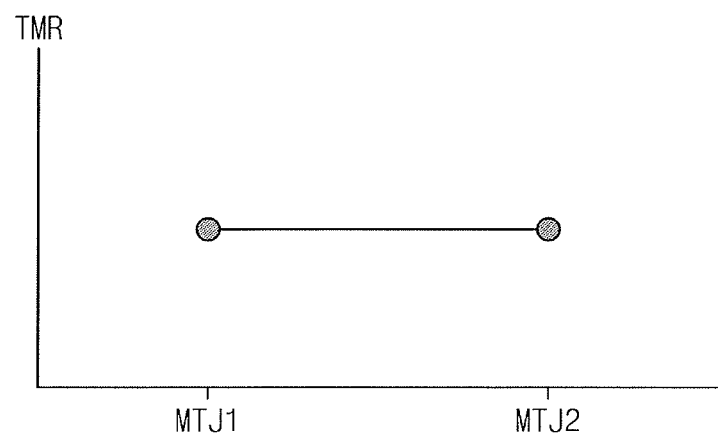
FIGS. 10A and 10B illustrate graphs showing characteristics of first and second magnetic tunnel junction patterns according to some embodiments.
Figure 10B:
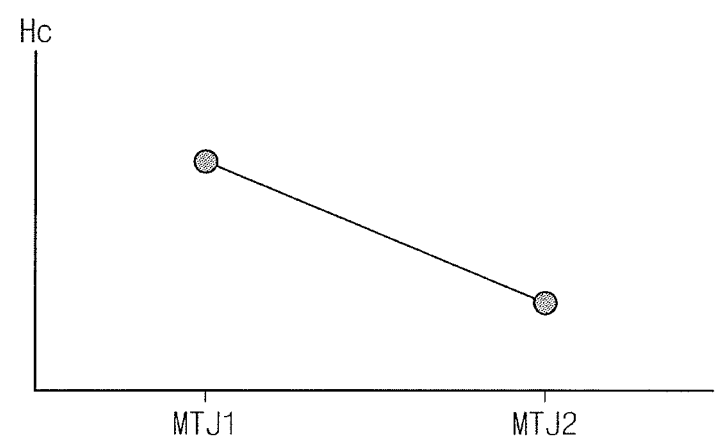

FIGS. 10A and 10B illustrate graphs showing characteristics of first and second magnetic tunnel junction patterns MTJ1 and MTJ2 according to some embodiments. FIG. 10A shows tunnel magnetoresistance ratios (TMR) of the first and second magnetic tunnel junction patterns MTJ1 and MTJ2, and FIG. 10B shows coercive forces Hc of the first and second magnetic tunnel junction patterns MTJ1 and MTJ2. Referring to FIGS. 10A and 10B, the tunnel magnetoresistance ratios of the first and second magnetic tunnel junction patterns MTJ1 and MTJ2 may be equal to each other, but the first magnetic tunnel junction pattern MTJ1 may have a higher retention characteristic than the second magnetic tunnel junction pattern MTJ2. For example, the second magnetic tunnel junction pattern MTJ2 may be more easily switched than the first magnetic tunnel junction pattern MTJ1.

Thus, the first magnetic tunnel junction pattern MTJ1 on the first region AR1 and the second magnetic tunnel junction pattern MTJ2 on the second region AR2 may function as different applications or perform different functions from each other. For example, the first magnetic tunnel junction pattern MTJ1 on the first region AR1 may function as a non-volatile memory (NVM) cell, and the second magnetic tunnel junction pattern MTJ2 on the second region AR2 may function as a random access memory (RAM) cell. As a result, the memory cells performing different functions may be formed on the substrate 100 by merely adjusting the thicknesses of the first and second oxide patterns 112 and 110 and the free patterns FP1 and FP2 of the magnetic tunnel junction patterns MTJ1 and MTJ2, without having to form different kinds of memory elements on the substrate 100.

Each of the bottom electrode patterns BEP may be electrically connected to a corresponding one of the lower contact plugs 104 in the lower interlayer insulating layer 102. Each of the magnetic tunnel junction patterns MTJ1 and MTJ2 may be formed between the bottom electrode pattern BEP and the top electrode pattern TEP.

The upper interlayer insulating layer 140 may be formed on the lower interlayer insulating layer 102 to cover the bottom electrode patterns BEP, the magnetic tunnel junction patterns MTJ1 and MTJ2, and the top electrode patterns TEP. The upper contact plugs 150 may be formed in the upper interlayer insulating layer 140. The upper contact plugs 150 may penetrate the upper interlayer insulating layer 140 to be connected to the top electrode patterns TEP, respectively. The upper interlayer insulating layer 140 may include an oxide layer, a nitride layer, and/or an oxynitride layer, and the upper contact plugs 150 may include a metal (e.g., titanium, tantalum, copper, aluminum, or tungsten) or a conductive metal nitride (e.g., titanium nitride or tantalum nitride). The interconnection line 160 may be formed on the upper interlayer insulating layer 140. The interconnection line 160 may be connected to the upper contact plug 150. The interconnection line 160 may include a metal (e.g., titanium, tantalum, copper, aluminum, or tungsten) or a conductive metal nitride (e.g., titanium nitride or tantalum nitride). In an implementation, the interconnection line 160 may be a bit line.

Figure 11:
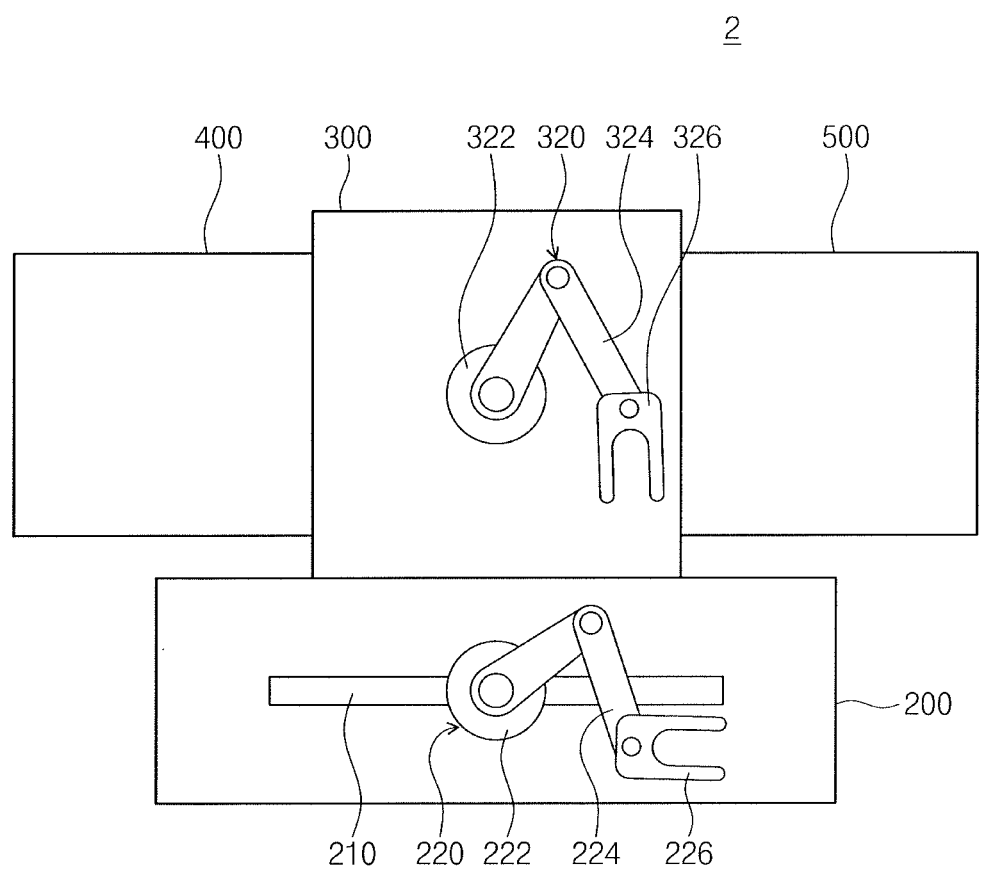
FIG. 11 illustrates a schematic view of an embodiment of a substrate treating apparatus for performing an oxidation process and a deposition process of a second hard mask layer of FIG. 6.
Figure 12:
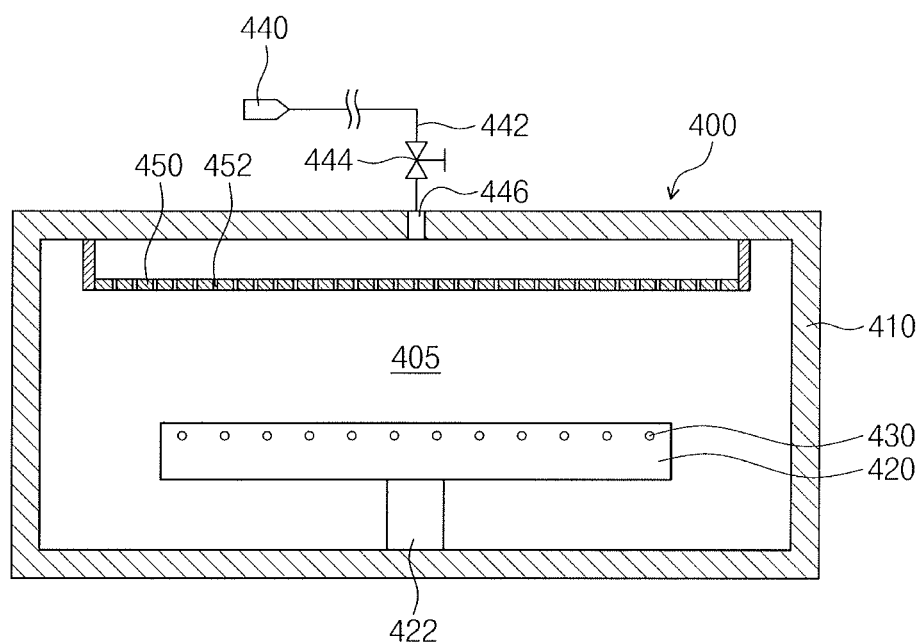
FIG. 12 illustrates a schematic view of a first process chamber of FIG. 11.
Figure 13:
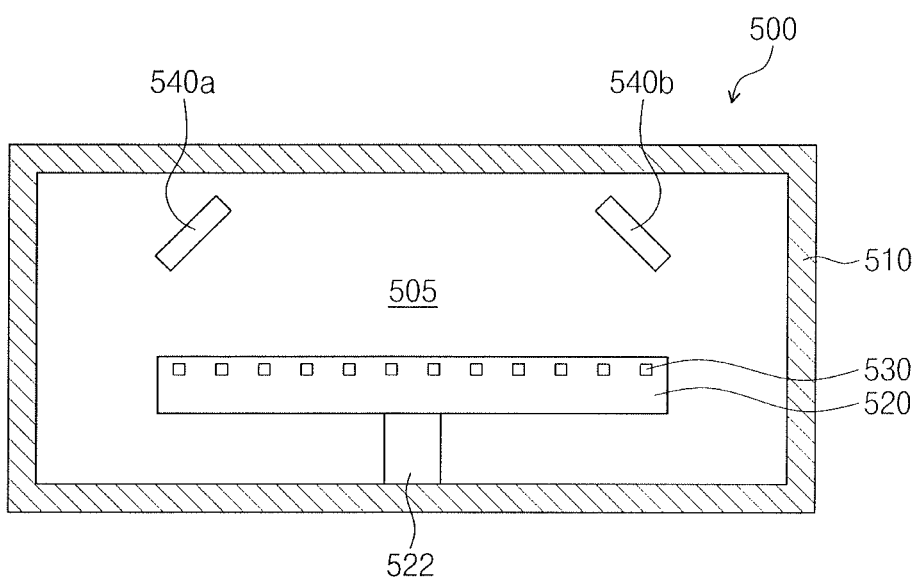
FIG. 13 illustrates a schematic view of a second process chamber of FIG. 11.

FIG. 11 illustrates a schematic view of an embodiment of a substrate treating apparatus for performing an oxidation process and a deposition process of a second hard mask layer of FIG. 6. FIG. 12 illustrates a schematic view of a first process chamber of FIG. 11, and FIG. 13 illustrates a schematic view of a second process chamber of FIG. 11.

Referring to FIG. 11, a substrate treating apparatus 2 may include an index module 200, a transfer module 300, a first process chamber 400, and a second process chamber 500.

The index module 200 may include a guide rail 210 and a first substrate transfer unit 220. The guide rail 210 may extend in one direction. The first substrate transfer unit 220 may include a first support shaft 222, a first arm 224, and a first substrate support part 226. The first support shaft 222 may be coupled to the guide rail 210. The first arm 224 may connect the first support shaft 222 and the first substrate support part 226. The first substrate support part 226 may support a substrate. The index module 200 may import/export a substrate from/into another apparatus and/or another substrate transfer unit outside the substrate treating apparatus 2. In an implementation, the index module 200 may include an equipment front end module (EFEM) and/or a road port.

The transfer module 300 may be adjacent to the index module 200. The transfer module 300 may include a second substrate transfer unit 320. The second substrate transfer unit 320 may include a second support shaft 322, a second arm 324, and a second substrate support part 326. The second arm 324 may connect the second support shaft 322 and the second substrate support part 326. The second substrate support part 326 may support a substrate. The transfer module 300 may transfer a substrate among the index module 200, the first process chamber 400, and the second process chamber 500. In an implementation, a load lock chamber may be provided between the transfer module 300 and the index module 200.

Referring to FIGS. 11 and 12, the first process chamber 400 may be at a side of the transfer module 300. The first process chamber 400 may include a first chamber body 410, a first support part 420, a heater 430, a gas supply 440, and a shower head 450. The first chamber body 410 may provide an inner space 405 in which the oxidation process is performed. A substrate may be loaded on a top surface of the first support part 420. The first support part 420 may be an electrostatic chuck. The first support part 420 may be coupled to the first chamber body 410 by a support shaft 422. The heater 430 may be provided in the first support part 420.

The gas supply 440 may be configured to supply a process gas into the inner space 405. For example, the process gas may be an oxygen gas. An oxygen gas in the gas supply 440 may be supplied into a gas supply hole 446 through a gas supply line 442. The gas supply hole 446 may be in one side portion of the first chamber body 410. A gas supply valve 444 may open or close the gas supply line 442.

The shower head 450 may face the top surface of the first support part 420. The shower head 450 may include holes 452. The process gas may be uniformly supplied into the inner space 405 through the shower head 450. In an implementation, the first process chamber 400 may include an additional process gas supply and/or a RF power supply unit.

Referring to FIGS. 11 and 13, the second process chamber 500 may be at another side of the transfer module 300. The second process chamber 500 may include a second chamber body 510, a second support part 520, a cooler 530, and target parts 540a and 540b. The second chamber body 510 may provide an inner space 505 in which the deposition process of the second hard mask layer is performed. A substrate may be loaded on a top surface of the second support part 520. The second support part 520 may be an electrostatic chuck. The second support part 520 may be coupled to the second chamber body 510 by a support shaft 522. The cooler 530 may be provided in the second support part 520.

The second hard mask layer may be deposited by, e.g., a sputtering process. The sputtering process may be a radio frequency (RF) sputtering process using at least one target part. In an implementation, referring to FIG. 13, the RF sputtering process may be performed using a plurality of target parts 540a and 540b. In an implementation, a different kind of a deposition process may be performed.

The first process chamber 400 and the second process chamber 500 may share the same transfer module 300. Thus, the oxidation process and the formation of the second hard mask layer may be performed in-situ in the same apparatus. The oxidation process of the high temperature and the formation of the second hard mask layer may be performed under an ultra-high vacuum, and thus constancy of a process environment may be maintained by the in-situ apparatus. The components and arrangement of the first and second process chambers are illustrated as an example in FIGS. 11 to 13. In an implementation, the components and arrangement of the first and second process chambers for performing the oxidation process and the deposition process may be variously modified.

Figure 14:
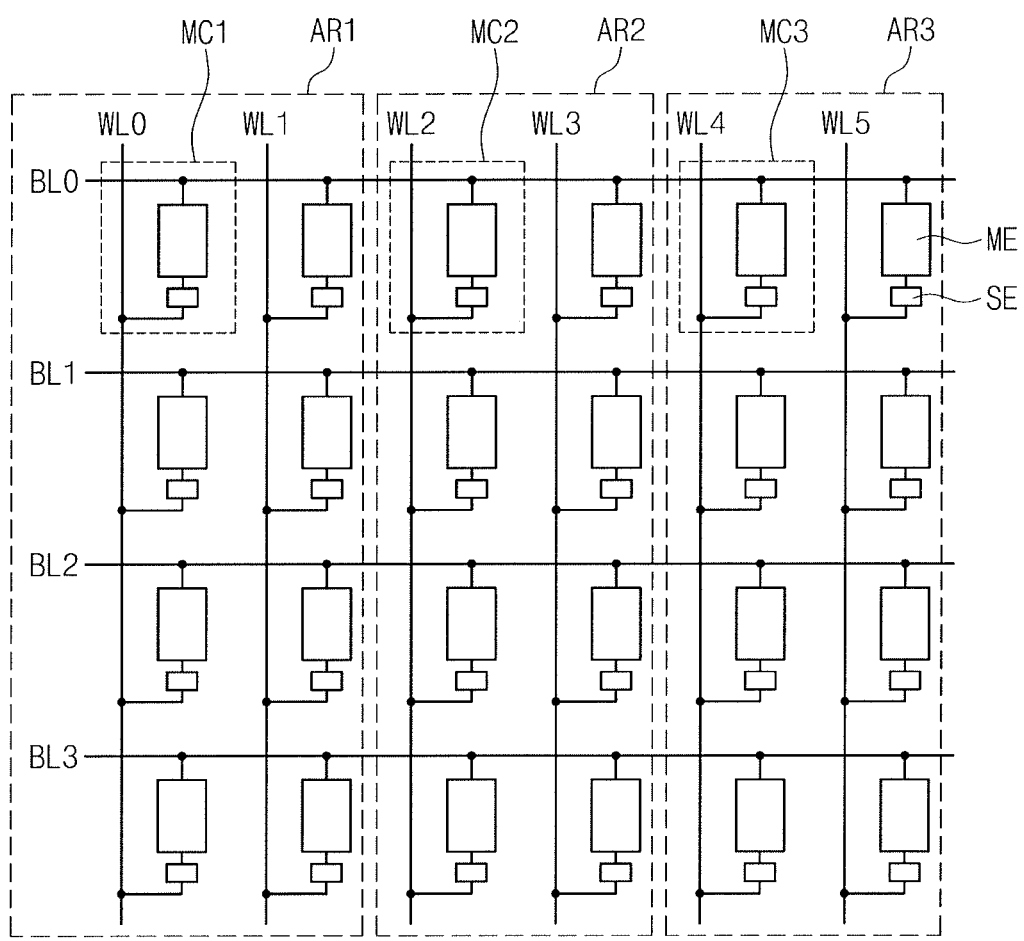
FIG. 14 illustrates a circuit diagram of a memory cell array of a magnetic memory device according to some embodiments.
Figure 15:
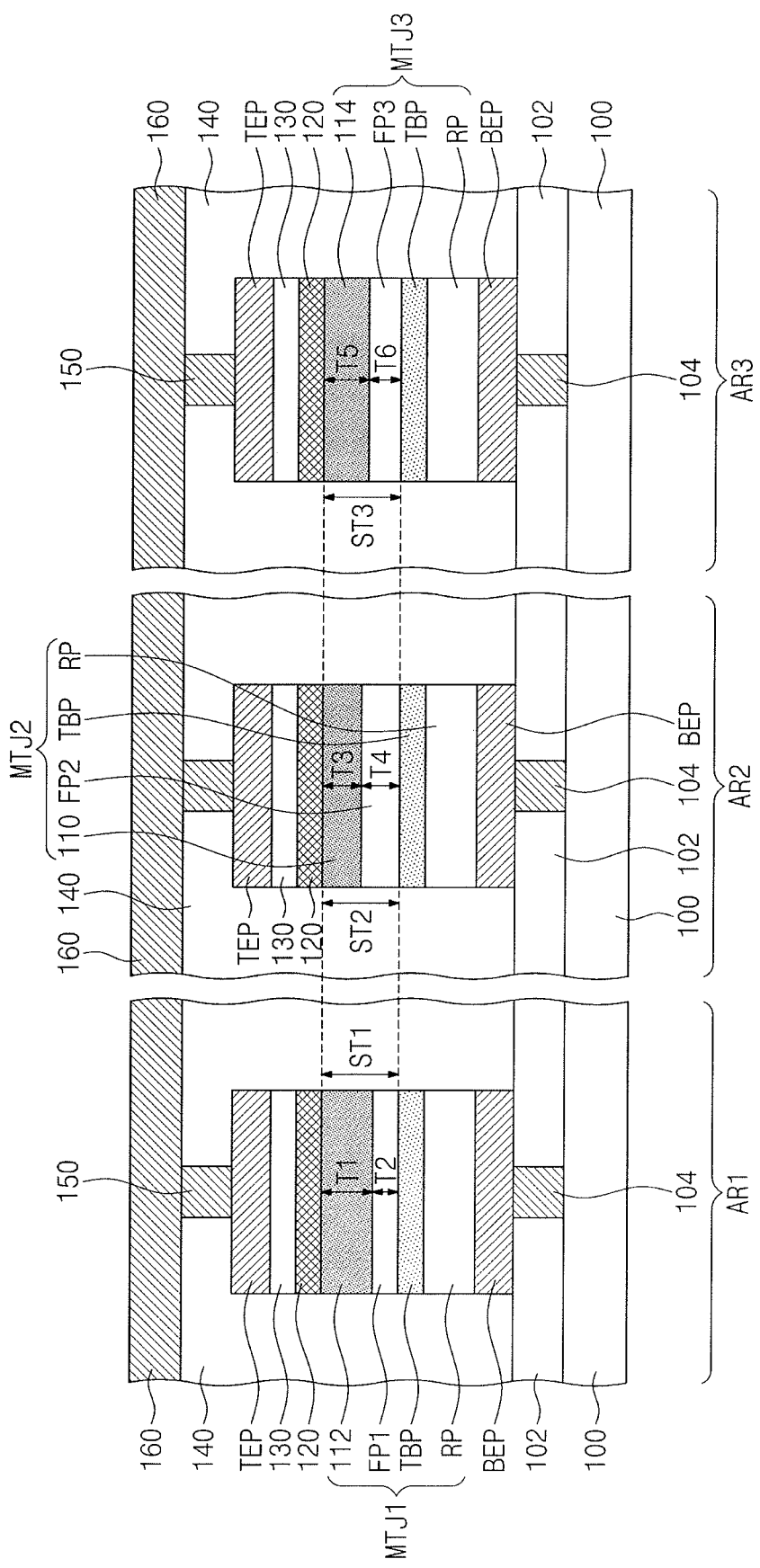
FIG. 15 illustrates a cross-sectional view of a magnetic memory device according to some embodiments.

FIG. 14 illustrates a circuit diagram of a memory cell array of a magnetic memory device according to some embodiments, and FIG. 15 illustrates a cross-sectional view of a magnetic memory device according to some embodiments. Hereinafter, the descriptions to the same or similar elements as in the above embodiments of FIGS. 2 and 4 may be omitted for the purpose of ease and convenience in explanation.

A substrate 100 may include a first region AR1, a second region AR2, and a third region AR3. A third magnetic tunnel junction pattern MTJ3 may be on the third region AR3. The third magnetic tunnel junction pattern MTJ3 may include a pinned pattern RP, a third free pattern FP3, a tunnel barrier pattern TBP between the pinned pattern RP and the third free pattern FP3, and a third oxide pattern 114. The third free pattern FP3 may be between the tunnel barrier pattern TBP and a top electrode pattern TEP on the third region AR3, and the pinned pattern RP may be between the tunnel barrier pattern TBP and a bottom electrode pattern BEP on the third region AR3. The third oxide pattern 114 may be spaced apart from the tunnel barrier pattern TBP with the third free pattern FP3 therebetween. The third oxide pattern 114 may be between the third free pattern FP3 and the top electrode pattern TEP.

The third oxide pattern 114 may include a metal oxide. The third oxide pattern 114 may include a non-magnetic metal element and an oxygen element. For example, the non-magnetic metal element may include Ta, Ti, Mg, Hf, Zr, W, or Mo.

A ratio of a thickness T5 of the third oxide pattern 114 to a thickness T6 of the third free pattern FP3 may be different from the ratio of the thickness T1 of the first oxide pattern 112 to the thickness T2 of the first free pattern FP1 and different from the ratio of the thickness T3 of the second oxide pattern 110 to the thickness T4 of the second free pattern FP2. The ratio of the thickness T5 of the third oxide pattern 114 to the thickness T6 of the third free pattern FP3 may be less than the ratio of the thickness T1 of the first oxide pattern 112 to the thickness T2 of the first free pattern FP1 and may be greater than the ratio of the thickness T3 of the second oxide pattern 110 to the thickness T4 of the second free pattern FP2. For example, the ratio of the thickness T1 of the first oxide pattern 112 to the thickness T2 of the first free pattern FP1 may be 1.2:0.8, the ratio of the thickness T3 of the second oxide pattern 110 to the thickness T4 of the second free pattern FP2 may be 0.8:1.2, and the ratio of the thickness T5 of the third oxide pattern 114 to the thickness T6 of the third free pattern FP3 may be 1.1:0.9. A sum ST3 of the thickness T5 of the third oxide pattern 114 and the thickness T6 of the third free pattern FP3 may be equal to the sum ST1 of the thickness T1 of the first oxide pattern 112 and the thickness T2 of the first free pattern FP1 and equal to the sum ST2 of the thickness T3 of the second oxide pattern 110 and the thickness T4 of the second free pattern FP2.

The third free pattern FP3 may be in contact with (e.g., may directly contact) the third oxide pattern 114. An oxygen concentration of the third oxide pattern 114 may be lower than the oxygen concentration of the first oxide pattern 112 and may be higher than the oxygen concentration of the second oxide pattern 110. Here, the oxygen concentration of each of the oxide patterns 112, 110 and 114 may be defined as a value obtained by converting a ratio of the number of oxygen atoms to the total number of atoms in each oxide pattern 112, 110 or 114 into a percentage.

Thus, switching characteristics of the first, second, and third magnetic tunnel junction patterns MTJ1, MTJ2 and MTJ3 may be different from each other. For example, switching currents to change the magnetization directions of the first, second and third free patterns FP1, FP2 and FP3 of the first, second and third magnetic tunnel junction patterns MTJ1, MTJ2 and MTJ3, respectively, may be different from each other. For example, the first magnetic tunnel junction pattern MTJ1 may have a higher retention characteristic than the second magnetic tunnel junction pattern MTJ2, and the second magnetic tunnel junction pattern MTJ2 may be more easily switched than the first magnetic tunnel junction pattern MTJ1. The third magnetic tunnel junction pattern MTJ3 may have a higher retention characteristic than the second magnetic tunnel junction pattern MTJ2 and may be more easily switched than the first magnetic tunnel junction pattern MTJ1.

Thus, the first magnetic tunnel junction pattern MTJ1 on the first region AR1, the second magnetic tunnel junction pattern MTJ2 on the second region AR2, and the third magnetic tunnel junction pattern MTJ3 on the third region AR3 may function as different applications or may perform different functions from each other. For example, the first magnetic tunnel junction pattern MTJ1 on the first region AR1 may function as a non-volatile memory (NVM) cell MC1 of FIG. 14, the second magnetic tunnel junction pattern MTJ2 on the second region AR2 may function as a static random access memory (SRAM) cell MC2 of FIG. 14, and the third magnetic tunnel junction pattern MTJ3 on the third region AR3 may function as a dynamic random access memory (DRAM) cell MC3 of FIG. 14. As a result, the memory cells performing different functions may be formed on the substrate 100 by merely adjusting the thicknesses of the oxide patterns 112, 110 and 114 and the free patterns FP1, FP2 and FP3 of the magnetic tunnel junction patterns MTJ1, MTJ2 and MTJ3, without having to form different kinds of memory elements on the substrate 100.

Figure 16:
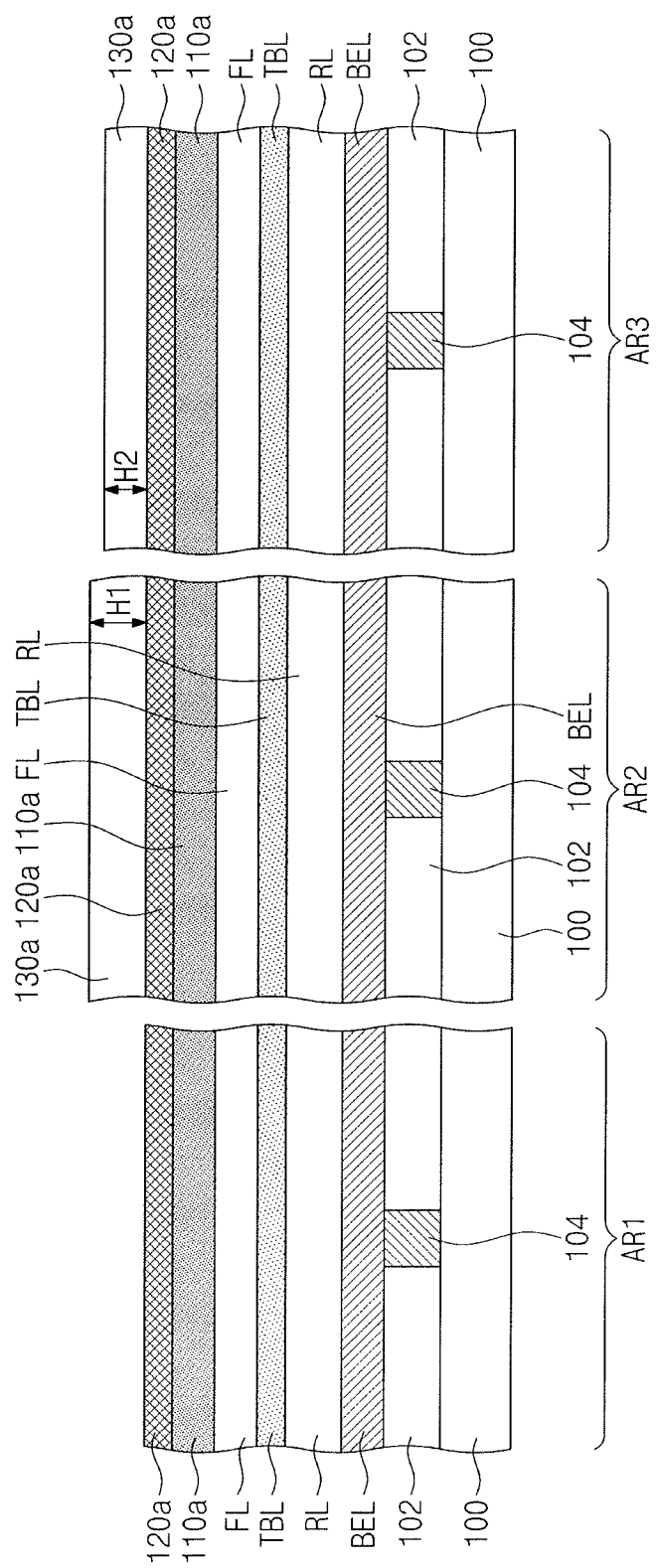
Figure 17:
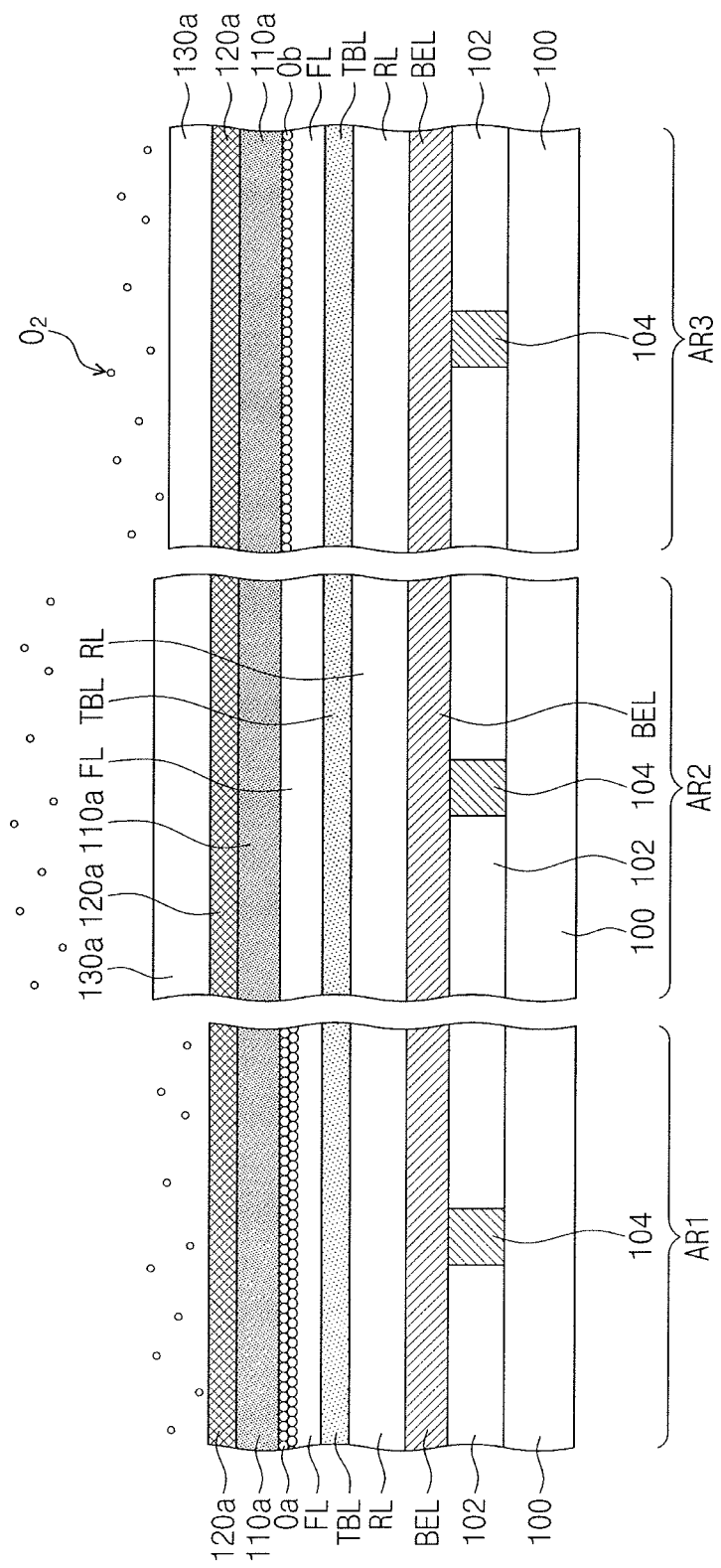

FIGS. 16 to 18 illustrate cross-sectional views of stages in a method for manufacturing the magnetic memory device of FIG. 15. Hereinafter, the descriptions to the same or similar processes as in the above embodiments of FIGS. 6 to 9 may be omitted for the purpose of ease and convenience in explanation. For example, a manufacturing method according to the present embodiments may include forming the first magnetic layer RL on the substrate 100 (S110), forming the tunnel barrier layer TBL on the first magnetic layer RL (S120), forming the second magnetic layer FL on the tunnel barrier layer TBL (S130), forming the oxide layer 110a on the second magnetic layer FL (S140), and forming the capping layer 120a on the oxide layer 110a (S150), described in the above embodiments.

Referring to FIG. 16, a first hard mask layer 130a may be formed on (e.g., part of) the capping layer 120a. The first hard mask layer 130a may not be formed on the first region AR1 and may be formed on the second region AR2 and the third region AR3. The capping layer 120a on the first region AR1 may be exposed, and the capping layer 120a on the second and third regions AR2 and AR3 may be covered by the first hard mask layer 130a. For example, the first hard mask layer 130a may be formed on a partial region of the substrate 100. The first hard mask layer 130a may be formed using an ALD method, a PVD method, or a CVD method.

The first hard mask layer 130a on the second region AR2 may have a first thickness H1, and the first hard mask layer 130a on the third region AR3 may have a second thickness H2. The first thickness H1 may be greater than the second thickness H2. For example, the first thickness H1 may range from 100 Å to 500 Å, and the second thickness H2 may range from 50 Å to 100 Å. Controlling the thickness of the first hard mask layer 130a may be performed by a selective deposition method, an etching method after deposition, and/or a lift-off method. In the lift-off method, a photoresist layer may be coated on an entire top surface of the substrate 100, and then, a portion of the photoresist layer may be removed by exposure and development processes. Thereafter, a hard mask layer may be deposited, and then, a remaining photoresist layer and a portion of the hard mask layer may be removed to form the first hard mask layer 130a.

Referring to FIG. 17, an oxidation process may be performed. The oxidation process may be performed by thermally treating the substrate 100. At this time, the oxidation process may be performed at a temperature of 50° C. to 600° C. The oxidation process may be performed at a pressure of an ultra-high vacuum ($1E^{-10}$ torr) to atmospheric pressure. Oxygen atoms Oa in the oxide layer 110a of the first region AR1 may be diffused to the interface of the oxide layer 110a and the second magnetic layer FL by the oxidation process of the high temperature. In addition, diffusion of oxygen atoms in the oxide layer 110a of the second region AR2 may be inhibited or prevented by the first hard mask layer 130a. Oxygen atoms Ob in the oxide layer 110a of the third region AR3 may be diffused to an interface of the oxide layer 110a and the second magnetic layer FL. Due to the first hard mask layer 130a of the third region AR3, the amount of the diffused oxygen atoms Ob of the third region AR3 may be less than the amount of the diffused oxygen atoms Oa of the first region AR1.

At this time, oxygen ($O_2$) gas may be supplied to control an oxygen concentration. For example, the oxygen concentration in a process chamber may range from 0.001% to 100% (e.g., volume %). The oxygen ($O_2$) gas may be additionally supplied to promote movement of the oxygen atoms.

Referring to FIG. 18, the oxygen atoms Oa (see FIG. 17) of the first region AR1 may be diffused, and thus an oxide layer 112a of the first region AR1 may be expanded. Therefore, a second magnetic layer FLa of the first region AR1 may be relatively reduced. The oxygen atoms Ob (see FIG. 17) of the third region AR3 may be diffused, and thus an oxide layer 114a of the third region AR3 may also be expanded. Therefore, a second magnetic layer FLb of the third region AR3 may be relatively reduced. For example, a thickness T1 of the oxide layer 112a of the first region AR1 may be increased as compared with a thickness T3 of the oxide layer 110a of the second region AR2, and a thickness T2 of the second magnetic layer FLa of the first region AR1 may be reduced as compared with a thickness T4 of the second magnetic layer FL of the second region AR2. A thickness T5 of the oxide layer 114a of the third region AR3 may be increased as compared with the thickness T3 of the oxide layer 110a of the second region AR2, and a thickness T6 of the second magnetic layer FLb of the third region AR3 may be reduced as compared with the thickness T4 of the second magnetic layer FL of the second region AR2. The thickness T5 of the oxide layer 114a of the third region AR3 may be less than the thickness T1 of the oxide layer 112a of the first region AR1, and the thickness T6 of the second magnetic layer FLb of the third region AR3 may be greater than the thickness T2 of the second magnetic layer FLa of the first region AR1.

Thereafter, a second hard mask layer 135 may be formed on the first region AR1, the second region AR2, and the third region AR3. The second hard mask layer 135 may be deposited on the capping layer 120a of the first region AR1 and the first hard mask layer 130a of the second and third regions AR2 and AR3. The second hard mask layer 135 may be formed using an ALD method, a PVD method, or a CVD method. The second hard mask layer 135 may include the same material as the first hard mask layer 130a. Thereafter, the planarization process and the patterning process described above may be performed to form the magnetic tunnel junction patterns MTJ1, MTJ2 and MTJ3 of FIG. 15.

By way of summation and review, highly integrated and/or low-power magnetic memory devices may be desirable in the electronics industry. Thus, research may be conducted to satisfy these characteristics.

One or more embodiments may provide a magnetic memory device including magnetic tunnel junction patterns capable of functioning as different applications in different regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
    a substrate including a first memory region and a second memory region;
    a first magnetic tunnel junction pattern on the first memory region, the first magnetic tunnel junction pattern including a first free pattern and a first oxide pattern on the first free pattern; and
    a second magnetic tunnel junction pattern on the second memory region, the second magnetic tunnel junction pattern including a second free pattern and a second oxide pattern on the second free pattern,
    wherein a ratio of a thickness of the first oxide pattern to a thickness of the first free pattern is different from a ratio of a thickness of the second oxide pattern to a thickness of the second free pattern.

2. The magnetic memory device of claim 1, wherein a sum of the thickness of the first oxide pattern and the thickness of the first free pattern is equal to a sum of the thickness of the second oxide pattern and the thickness of the second free pattern.

3. The magnetic memory device of claim 1, wherein the ratio of the thickness of the first oxide pattern to the thickness of the first free pattern is greater than the ratio of the thickness of the second oxide pattern to the thickness of the second free pattern.

4. The magnetic memory device of claim 3, wherein:
    the first magnetic tunnel junction pattern defines a first memory cell of the first memory region,
    the second magnetic tunnel junction pattern defines a second memory cell of the second memory region,
    the first memory cell is a non-volatile memory (NVM) cell, and
    the second memory cell is a random access memory (RAM) cell.

5. The magnetic memory device of claim 1, wherein:
the first free pattern is in contact with the first oxide pattern, and
the second free pattern is in contact with the second oxide pattern.

6. The magnetic memory device of claim 1, wherein an oxygen concentration of the first oxide pattern is higher than an oxygen concentration of the second oxide pattern.

7. The magnetic memory device of claim 1, wherein the substrate further includes a third memory region, the magnetic memory device further comprising:
a third magnetic tunnel junction pattern on the third memory region, the third magnetic tunnel junction pattern including a third free pattern and a third oxide pattern on the third free pattern,
wherein a ratio of a thickness of the third oxide pattern to a thickness of the third free pattern is:
different from the ratio of the thickness of the first oxide pattern to the thickness of the first free pattern, and
different from the ratio of the thickness of the second oxide pattern to the thickness of the second free pattern.

8. The magnetic memory device of claim 7, wherein the ratio of the thickness of the third oxide pattern to the thickness of the third free pattern is:
less than the ratio of the thickness of the first oxide pattern to the thickness of the first free pattern, and
greater than the ratio of the thickness of the second oxide pattern to the thickness of the second free pattern.

9. The magnetic memory device of claim 7, wherein a sum of the thickness of the third oxide pattern and the thickness of the third free pattern is:
equal to a sum of the thickness of the first oxide pattern and the thickness of the first free pattern, and
equal to a sum of the thickness of the second oxide pattern and the thickness of the second free pattern.

10. The magnetic memory device of claim 7, wherein an oxygen concentration of the third oxide pattern is:
lower than an oxygen concentration of the first oxide pattern, and
higher than an oxygen concentration of the second oxide pattern.

11. The magnetic memory device of claim 7, wherein:
the first magnetic tunnel junction pattern defines a first memory cell of the first memory region,
the second magnetic tunnel junction pattern defines a second memory cell of the second memory region,
the third magnetic tunnel junction pattern defines a third memory cell of the third memory region,
the first memory cell is a non-volatile memory (NVM) cell,
the second memory cell is a static random access memory (SRAM) cell, and
the third memory cell is a dynamic random access memory (DRAM) cell.

12. The magnetic memory device of claim 1, wherein:
the first free pattern includes CoFeB, and
the second free pattern includes CoFeB.

* * * * *